(12) United States Patent
Morad et al.

(10) Patent No.: US 11,595,000 B2
(45) Date of Patent: Feb. 28, 2023

(54) HIGH EFFICIENCY CONFIGURATION FOR SOLAR CELL STRING

(71) Applicant: SunPower Corporation, San Jose, CA (US)

(72) Inventors: Ratson Morad, Palo Alto, CA (US); Nathan Beckett, Oakland, CA (US); John Gannon, Oakland, CA (US); Gilad Almogy, Palo Alto, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 0 days.

(21) Appl. No.: 16/900,660

(22) Filed: Jun. 12, 2020

(65) Prior Publication Data

US 2020/0304063 A1    Sep. 24, 2020

Related U.S. Application Data

(63) Continuation of application No. 16/112,288, filed on Aug. 24, 2018, now abandoned, which is a (Continued)

(51) Int. Cl.
*H01L 31/05* (2014.01)
*H02S 40/22* (2014.01)
(Continued)

(52) U.S. Cl.
CPC .......... *H02S 40/22* (2014.12); *H01L 31/0201* (2013.01); *H01L 31/028* (2013.01); *H01L 31/02245* (2013.01); *H01L 31/02327* (2013.01); *H01L 31/0392* (2013.01); *H01L 31/035281* (2013.01); *H01L 31/042* (2013.01);
(Continued)

(58) Field of Classification Search
CPC ......... H01L 31/0201; H01L 31/022245; H01L 31/02327; H01L 31/028; H01L 31/0392; H01L 31/044; H01L 31/048; H01L 31/05; H01L 31/0504; H01L 31/052; H01L 31/0747; H01L 31/042; H01L 31/0508
See application file for complete search history.

(56) References Cited

U.S. PATENT DOCUMENTS 2,938,938 A   5/1960   Dickson, Jr.
3,116,171 A   12/1963  Nielsen et al.
(Continued)

FOREIGN PATENT DOCUMENTS

CN   101884113 A   11/2010
DE   4017933 A1    12/1991
(Continued)

OTHER PUBLICATIONS

Cohen, Gilbert, et al., Final Report on the Operation and Maintenance Improvement Program for Concentrating Solar Power Plants, Jun. 1999, pp. 1-186, Issued by Sandia National Laboratories.
(Continued)

*Primary Examiner* — Bethany L Martin
(74) *Attorney, Agent, or Firm* — Schmidt Patent Law, Inc.

(57) ABSTRACT

A high efficiency configuration for a string of solar cells comprises series-connected solar cells arranged in an overlapping shingle pattern. Front and back surface metallization patterns may provide further increases in efficiency.

14 Claims, 11 Drawing Sheets

Related U.S. Application Data continuation of application No. 15/371,677, filed on Dec. 7, 2016, now abandoned, which is a continuation of application No. 13/801,432, filed on Mar. 13, 2013, now abandoned, which is a continuation of application No. 13/672,386, filed on Nov. 8, 2012, now abandoned.

(51) Int. Cl.

| | | |
|---|---|---|
| *H01L 31/042* | (2014.01) | |
| *H01L 31/048* | (2014.01) | |
| *H02S 40/36* | (2014.01) | |
| *H01L 31/044* | (2014.01) | |
| *H01L 31/02* | (2006.01) | |
| *H01L 31/0224* | (2006.01) | |
| *H01L 31/0232* | (2014.01) | |
| *H01L 31/028* | (2006.01) | |
| *H01L 31/0352* | (2006.01) | |
| *H01L 31/0392* | (2006.01) | |
| *H01L 31/052* | (2014.01) | |
| *H01L 31/0747* | (2012.01) | |

(52) U.S. Cl.
CPC .......... *H01L 31/044* (2014.12); *H01L 31/048* (2013.01); *H01L 31/052* (2013.01); *H01L 31/0504* (2013.01); *H01L 31/0508* (2013.01); *H01L 31/0747* (2013.01); *H02S 40/36* (2014.12); *Y02E 10/52* (2013.01)

(56) References Cited

U.S. PATENT DOCUMENTS

| | | |
|---|---|---|
| 3,340,096 A | 9/1967 | Mann et al. |
| 3,459,597 A | 8/1969 | Baron |
| 3,490,950 A | 1/1970 | Myer |
| 3,769,091 A | 10/1973 | Leinkram et al. |
| 3,811,181 A | 5/1974 | Leinkram et al. |
| 3,988,166 A | 10/1976 | Beam |
| 4,002,031 A | 1/1977 | Bell |
| 4,038,971 A | 8/1977 | Bezborodko |
| 4,078,544 A | 3/1978 | Hollands et al. |
| 4,178,913 A | 12/1979 | Hutchison |
| 4,180,414 A | 12/1979 | Diamond et al. |
| 4,243,019 A | 1/1981 | Severson |
| 4,249,514 A | 2/1981 | Jones |
| 4,257,821 A | 3/1981 | Kelly et al. |
| 4,281,900 A | 8/1981 | Lewis, Jr. |
| 4,296,737 A | 10/1981 | Silk |
| 4,332,238 A | 6/1982 | Garcia, Jr. |
| 4,337,758 A | 7/1982 | Meinel et al. |
| 4,351,319 A | 9/1982 | Robbins, Jr. |
| 4,361,717 A | 11/1982 | Gilmore et al. |
| 4,386,600 A | 6/1983 | Eggert, Jr. |
| 4,388,481 A | 6/1983 | Uroshevich |
| 4,422,443 A | 12/1983 | Arendt |
| 4,422,893 A | 12/1983 | Duchateau et al. |
| 4,427,838 A | 1/1984 | Goldman |
| 4,435,043 A | 3/1984 | Mertens et al. |
| 4,454,371 A | 6/1984 | Folino |
| 4,577,051 A | 3/1986 | Hartman |
| 4,617,420 A | 10/1986 | Dilts et al. |
| 4,617,421 A | 10/1986 | Nath et al. |
| 4,652,693 A | 3/1987 | Bar-on |
| 4,719,904 A | 1/1988 | O'Neill |
| 4,771,764 A | 9/1988 | Cluff |
| 4,846,151 A | 7/1989 | Simko, Jr. |
| 4,877,460 A | 10/1989 | Flodl |
| 4,877,959 A | 10/1989 | Page |
| 5,054,466 A | 10/1991 | White et al. |
| 5,118,361 A | 6/1992 | Fraas et al. |
| 5,178,685 A | 1/1993 | Borenstein et al. |
| 5,191,876 A | 3/1993 | Atchley |
| 5,253,637 A | 10/1993 | Maiden |
| 5,344,497 A | 9/1994 | Fraas et al. |
| 5,401,329 A | 3/1995 | Fraas et al. |
| 5,498,297 A | 3/1996 | O'Neill et al. |
| 5,505,789 A | 4/1996 | Fraas et al. |
| 5,505,917 A | 4/1996 | Collier, Jr. |
| 5,542,409 A | 8/1996 | Sampayo |
| 5,590,495 A | 1/1997 | Bressler et al. |
| 5,616,185 A | 4/1997 | Kukulka |
| 5,994,641 A | 11/1999 | Kardauskas et al. |
| 6,020,555 A | 2/2000 | Garboushian et al. |
| 6,034,322 A | 3/2000 | Pollard |
| 6,080,927 A | 6/2000 | Johnson |
| 6,082,353 A | 7/2000 | Van Doom et al. |
| 6,123,067 A | 9/2000 | Warrick |
| 6,218,605 B1 | 4/2001 | Daily et al. |
| 6,232,545 B1 | 5/2001 | Samaras et al. |
| 6,276,359 B1 | 8/2001 | Frazier |
| 6,303,853 B1 | 10/2001 | Fraas et al. |
| 6,307,146 B1 | 10/2001 | Takeuchi et al. |
| 6,315,575 B1 | 11/2001 | Kajimoto |
| 6,353,175 B1 | 3/2002 | Fraas |
| 6,414,235 B1 | 7/2002 | Luch |
| 6,489,553 B1 | 7/2002 | Fraas et al. |
| 6,441,297 B1 | 8/2002 | Keller et al. |
| 6,525,262 B1 | 2/2003 | Makita et al. |
| 6,538,193 B1 | 3/2003 | Fraas |
| 6,563,289 B1 | 5/2003 | Cross |
| 6,573,445 B1 | 6/2003 | Burgers |
| 6,610,919 B2 | 8/2003 | Ohkubo |
| 6,620,645 B2 | 9/2003 | Chandra et al. |
| 6,653,550 B2 | 11/2003 | Hayashi et al. |
| 6,670,787 B2 | 12/2003 | Tachibana |
| 6,770,544 B2 | 8/2004 | Sawada |
| 6,803,513 B2 | 10/2004 | Beemink et al. |
| 6,946,081 B2 | 9/2005 | Voutchkov |
| 7,238,878 B2 | 7/2007 | Gonsiorawski |
| 7,271,333 B2 | 9/2007 | Fabick et al. |
| 7,388,146 B2 | 6/2008 | Fraas et al. |
| 7,390,961 B2 | 6/2008 | Aschenbrenner et al. |
| 7,507,903 B2 | 3/2009 | Luch |
| 7,534,699 B2 | 5/2009 | Wong et al. |
| 7,635,810 B2 | 12/2009 | Luch |
| 7,709,730 B2 | 5/2010 | Johnson et al. |
| 7,772,484 B2 | 8/2010 | Li et al. |
| 7,777,128 B2 | 8/2010 | Montello et al. |
| 7,781,672 B2 | 8/2010 | Guadiana et al. |
| 7,820,906 B2 | 10/2010 | Johnson et al. |
| 7,825,327 B2 | 11/2010 | Johnson et al. |
| 7,825,329 B2 | 11/2010 | Basol |
| 7,829,781 B2 | 11/2010 | Montello et al. |
| 7,829,785 B2 | 11/2010 | Basol |
| 7,851,700 B2 | 12/2010 | Luch |
| 7,868,249 B2 | 1/2011 | Luch |
| 7,872,192 B1 | 1/2011 | Fraas et al. |
| 7,926,480 B2 | 4/2011 | LeLievre |
| 7,932,461 B2 | 4/2011 | Johnson et al. |
| 7,952,057 B2 | 5/2011 | Finot et al. |
| 7,968,791 B2 | 6/2011 | Do et al. |
| 7,989,692 B2 | 8/2011 | Luch |
| 7,989,693 B2 | 8/2011 | Luch |
| 8,039,777 B2 | 10/2011 | Lance et al. |
| 8,049,150 B2 | 11/2011 | Johnson et al. |
| 8,071,930 B2 | 12/2011 | Wylie et al. |
| 8,083,362 B2 | 12/2011 | Finot et al. |
| 8,110,737 B2 | 2/2012 | Luch |
| 8,134,104 B2 | 3/2012 | Finot et al. |
| 8,138,413 B2 | 3/2012 | Luch et al. |
| 8,207,440 B2 | 6/2012 | Basol |
| 8,222,513 B2 | 7/2012 | Luch |
| 8,304,646 B2 | 11/2012 | Luch |
| 8,319,097 B2 | 11/2012 | Luch |
| 8,334,451 B2 | 12/2012 | Polce et al. |
| 8,378,209 B2 | 2/2013 | Masson et al. |
| 8,410,351 B1 | 4/2013 | Gu |
| 8,574,943 B2 | 11/2013 | Murray et al. |
| 8,586,857 B2 | 11/2013 | Everson et al. |
| 8,729,385 B2 | 5/2014 | Luch |
| 8,766,090 B2 | 7/2014 | Sewell et al. |

(56) References Cited

U.S. PATENT DOCUMENTS

| | | |
|---|---|---|
| 2001/0017154 A1 | 8/2001 | Washio |
| 2003/0000571 A1 | 1/2003 | Wakuda et al. |
| 2003/0024802 A1 | 2/2003 | Burgos |
| 2003/0029494 A1 | 2/2003 | Ohkubo |
| 2003/0121228 A1 | 7/2003 | Stoehr et al. |
| 2003/0201007 A1 | 10/2003 | Fraas et al. |
| 2003/0201008 A1 | 10/2003 | Lawheed |
| 2004/0055594 A1 | 3/2004 | Hochberg et al. |
| 2004/0093965 A1 | 5/2004 | Harcastle, III |
| 2004/0261836 A1 | 12/2004 | Kataoka et al. |
| 2005/0081910 A1 | 4/2005 | Danielson et al. |
| 2005/0133082 A1 | 6/2005 | Konold et al. |
| 2005/0217717 A1 | 10/2005 | Faris |
| 2006/0016772 A1 | 1/2006 | Presher et al. |
| 2006/0150967 A1 | 7/2006 | Hoelle et al. |
| 2006/0231133 A1 | 10/2006 | Fork et al. |
| 2006/0249143 A1 | 11/2006 | Straka |
| 2007/0034207 A1 | 2/2007 | Niedermeyer |
| 2007/0056579 A1 | 3/2007 | Straka |
| 2007/0068162 A1 | 3/2007 | Komura et al. |
| 2007/0089775 A1 | 4/2007 | Lasich |
| 2007/0175871 A1 | 8/2007 | Brezni et al. |
| 2007/0251569 A1 | 11/2007 | Shan et al. |
| 2007/0283996 A1 | 12/2007 | Hachtmann et al. |
| 2007/0283997 A1 | 12/2007 | Hachtmann et al. |
| 2007/0295381 A1 | 12/2007 | Fuji et al. |
| 2008/0053701 A1 | 3/2008 | Antaya et al. |
| 2008/0127967 A1 | 6/2008 | Kimura et al. |
| 2008/0156365 A1 | 7/2008 | Scholz et al. |
| 2008/0216887 A1 | 9/2008 | Hacke et al. |
| 2008/0271776 A1 | 11/2008 | Morgan |
| 2008/0302357 A1 | 12/2008 | DeNault |
| 2008/0302418 A1 | 12/2008 | Buller et al. |
| 2008/0308091 A1 | 12/2008 | Corio |
| 2008/0308094 A1 | 12/2008 | Johnston |
| 2009/0000662 A1 | 1/2009 | Harwood et al. |
| 2009/0014058 A1 | 1/2009 | Croft et al. |
| 2009/0038671 A1 | 2/2009 | Yamaguchi |
| 2009/0056698 A1 | 3/2009 | Johnson et al. |
| 2009/0056785 A1 | 3/2009 | Johnson et al. |
| 2009/0056786 A1 | 3/2009 | Johnson et al. |
| 2009/0056787 A1 | 3/2009 | Johnson et al. |
| 2009/0065045 A1 | 3/2009 | Tsadka et al. |
| 2009/0114261 A1 | 5/2009 | Stancel et al. |
| 2009/0114281 A1 | 5/2009 | Gobel |
| 2009/0119914 A1 | 5/2009 | Clark et al. |
| 2009/0126774 A1 | 5/2009 | Taylor et al. |
| 2009/0173375 A1 | 7/2009 | Frazier et al. |
| 2009/0178704 A1 | 7/2009 | Kalejs et al. |
| 2009/0183731 A1 | 7/2009 | Capan |
| 2009/0211644 A1 | 8/2009 | Wylie et al. |
| 2009/0308379 A1 | 12/2009 | Capan |
| 2009/0314283 A1 | 12/2009 | Kimura et al. |
| 2010/0000165 A1 | 1/2010 | Koller |
| 2010/0031991 A1 | 2/2010 | Mochizuki et al. |
| 2010/0043863 A1 | 2/2010 | Wudu et al. |
| 2010/0071752 A1 | 3/2010 | Vellore et al. |
| 2010/0078057 A1 | 4/2010 | Karg et al. |
| 2010/0078064 A1 | 4/2010 | Coakley |
| 2010/0084004 A1 | 4/2010 | Ortabasi |
| 2010/0089435 A1 | 4/2010 | Lockenhoff |
| 2010/0126554 A1 | 5/2010 | Morgan et al. |
| 2010/0131108 A1 | 5/2010 | Meyer |
| 2010/0132776 A1 | 6/2010 | Nakata |
| 2010/0136748 A1 | 6/2010 | Autry |
| 2010/0144218 A1* | 6/2010 | Rose ............... H01L 31/0516 439/883 |
| 2010/0147347 A1 | 6/2010 | Dyreby et al. |
| 2010/0147364 A1 | 6/2010 | Gonzalez et al. |
| 2010/0163014 A1 | 7/2010 | Johnson et al. |
| 2010/0170501 A1 | 7/2010 | Albritton |
| 2010/0193014 A1 | 8/2010 | Johnson et al. |
| 2010/0207951 A1 | 8/2010 | Plaisted et al. |
| 2010/0218799 A1 | 9/2010 | Stefani |
| 2010/0218807 A1 | 9/2010 | Arbore et al. |
| 2010/0224230 A1 | 9/2010 | Luch et al. |
| 2010/0236626 A1 | 9/2010 | Finot et al. |
| 2010/0243024 A1 | 9/2010 | Hashimoto et al. |
| 2010/0288332 A1 | 11/2010 | O'Neill et al. |
| 2010/0294336 A1 | 11/2010 | Johnson et al. |
| 2010/0319684 A1 | 12/2010 | Almogy et al. |
| 2011/0005572 A1 | 1/2011 | Shimizu |
| 2011/0017257 A1 | 1/2011 | Lee et al. |
| 2011/0017267 A1 | 1/2011 | Lichy et al. |
| 2011/0023940 A1 | 2/2011 | Do et al. |
| 2011/0036345 A1 | 2/2011 | Almogy et al. |
| 2011/0048501 A1 | 3/2011 | Jaus et al. |
| 2011/0061719 A1 | 3/2011 | Tsadka et al. |
| 2011/0108090 A1 | 5/2011 | Lance et al. |
| 2011/0114154 A1 | 5/2011 | Lichy et al. |
| 2011/0132457 A1 | 6/2011 | Finot |
| 2011/0146747 A1 | 6/2011 | Hieslmair |
| 2011/0155209 A1 | 6/2011 | Tober et al. |
| 2011/0162692 A1 | 7/2011 | Giacalone et al. |
| 2011/0168161 A1 | 7/2011 | Capan |
| 2011/0168237 A1 | 7/2011 | Takeda et al. |
| 2011/0168238 A1 | 7/2011 | Metin et al. |
| 2011/0192448 A1 | 8/2011 | Croft et al. |
| 2011/0197947 A1 | 8/2011 | Croft |
| 2011/0214714 A1 | 9/2011 | Aberle et al. |
| 2011/0226309 A1 | 9/2011 | Do et al. |
| 2011/0226310 A1 | 9/2011 | Johnson et al. |
| 2011/0240337 A1 | 10/2011 | Montello et al. |
| 2011/0265869 A1 | 11/2011 | Finot et al. |
| 2011/0271999 A1 | 11/2011 | Almogy et al. |
| 2011/0279918 A1 | 11/2011 | Almogy et al. |
| 2011/0284055 A1 | 11/2011 | Almogy et al. |
| 2011/0315184 A1 | 12/2011 | Kabade |
| 2012/0000502 A1 | 1/2012 | Medman et al. |
| 2012/0031457 A1 | 2/2012 | Taira et al. |
| 2012/0037206 A1 | 2/2012 | Norman et al. |
| 2012/0040487 A1 | 2/2012 | Asthana et al. |
| 2012/0042932 A1 | 2/2012 | Wylie et al. |
| 2012/0048349 A1 | 3/2012 | Metin et al. |
| 2012/0118355 A1 | 5/2012 | Rudolfs |
| 2012/0125391 A1 | 5/2012 | Pinarbasi et al. |
| 2012/0152327 A1 | 6/2012 | Pinarbasi et al. |
| 2012/0152349 A1 | 6/2012 | Cao et al. |
| 2012/0204938 A1 | 8/2012 | Hacke et al. |
| 2012/0234388 A1 | 9/2012 | Stancel et al. |
| 2012/0240995 A1 | 9/2012 | Coakley |
| 2012/0244656 A1 | 9/2012 | Kim et al. |
| 2012/0268087 A1 | 10/2012 | Kemahan |
| 2012/0279548 A1 | 11/2012 | Munch et al. |
| 2012/0318318 A1 | 12/2012 | Metin et al. |
| 2012/0318319 A1* | 12/2012 | Pinarbasi ............ H01L 31/0201 257/E33.001 |
| 2012/0325282 A1 | 12/2012 | Snow et al. |
| 2013/0096710 A1 | 4/2013 | Pinarbasi et al. |
| 2013/0112237 A1 | 5/2013 | Almogy et al. |
| 2013/0152996 A1 | 6/2013 | DeGroot et al. |
| 2013/0160823 A1 | 6/2013 | Khouri et al. |
| 2013/0160824 A1 | 6/2013 | Khouri et al. |
| 2013/0163137 A1* | 6/2013 | Johnston ................ H02S 50/00 361/91.6 |
| 2013/0206213 A1 | 8/2013 | He et al. |
| 2013/0206221 A1 | 8/2013 | Gannon et al. |
| 2014/0060610 A1 | 3/2014 | Moslehi et al. |
| 2014/0096823 A1 | 4/2014 | Fu et al. |
| 2014/0116495 A1 | 5/2014 | Kim et al. |
| 2014/0318613 A1 | 10/2014 | Von Campe et al. |

FOREIGN PATENT DOCUMENTS

| | | |
|---|---|---|
| DE | 4030713 A1 | 4/1992 |
| DE | 102006019638 A1 | 11/2007 |
| DE | 102009026027 A1 | 1/2011 |
| DE | 102010016975 A1 | 1/2011 |
| DE | 202011103199 U1 | 9/2012 |
| EP | 2284908 A1 | 2/2011 |
| EP | 2362430 A1 | 8/2011 |
| EP | 0020325810005 | 4/2012 |
| ES | 2146182 A1 | 7/2000 |
| FR | 910321001 | 1/1991 |

(56) References Cited

FOREIGN PATENT DOCUMENTS

| | | |
|---|---|---|
| JP | H0567017 U | 9/1993 |
| JP | H06140651 A | 5/1994 |
| JP | 11350685 A | 12/1999 |
| JP | 2003031829 A | 1/2003 |
| JP | 2008135655 A | 6/2008 |
| JP | 2009-521819 A | 6/2009 |
| JP | 2011-222920 A | 11/2011 |
| JP | 2014017447 A | 1/2014 |
| KR | 1020120122346 A | 11/2012 |
| WO | 1999042765 A1 | 8/1999 |
| WO | 2003022578 A1 | 3/2003 |
| WO | 2005057092 A1 | 6/2005 |
| WO | 2005090873 A1 | 9/2005 |
| WO | 2006000834 A1 | 1/2006 |
| WO | 2006120475 A1 | 11/2006 |
| WO | 2007022756 A2 | 3/2007 |
| WO | 2007087680 A1 | 8/2007 |
| WO | 2007109900 A1 | 10/2007 |
| WO | 2007110713 A1 | 10/2007 |
| WO | 2007129146 A1 | 11/2007 |
| WO | 2008105913 A2 | 9/2008 |
| WO | 2008112180 A2 | 9/2008 |
| WO | 2008143482 A2 | 11/2008 |
| WO | 2009002350 A1 | 12/2008 |
| WO | 2009011013 | 1/2009 |
| WO | 2009029275 A2 | 3/2009 |
| WO | 2009032917 A2 | 3/2009 |
| WO | 2009032920 A2 | 3/2009 |
| WO | 2009047815 A1 | 4/2009 |
| WO | 2010095583 A1 | 8/2010 |
| WO | 2011141198 A2 | 11/2011 |
| WO | 2011146177 A1 | 11/2011 |
| WO | 2011149589 A1 | 12/2011 |
| WO | 2012003235 A1 | 1/2012 |
| WO | 2012005747 A1 | 1/2012 |
| WO | 2012033657 A2 | 3/2012 |
| WO | 2012113478 A1 | 8/2012 |
| WO | 2013020590 A1 | 2/2013 |
| WO | 2014074826 A2 | 5/2014 |
| WO | 2014098771 A1 | 6/2014 |
| WO | 2014192272 A1 | 12/2014 |
| WO | 2015001413 A1 | 1/2015 |

OTHER PUBLICATIONS

Cohen, Gilbert et. al., Parabolic Trough Concentrator Development, USA Trough Third Annual Parabolic Trough Workshop, Jun. 18, 2000, pp. 1-13.

Creative Materials, "124-08 A/B Electrically Conductive Epoxy Adhesive", www.creativematerials.com, Apr. 22, 2010, Revision: E, 1 page.

King et al., "Silicon Concentrator Solar Cells Using Mass-Produced, Flat-Plate Cell Fabrication Technology", 0-7803-1220-1/93; 1993 IEEE, pp. 167-171.

Saga, "Advances in crystalline silicon solar cell technology for industrial mass production", vol. 2 Jul. 2010, NPG Asia Materials, pp. 96-102, www.natureasia.com/asia-materials, 2010 Tokyo Institute of Technology.

Zhao, et al., "20 000 PERL Silicon Cells for the '1996 World Solar Challenge' Solar Car Race", Progress in Photovaltaics: Research and Applications, vol. 5, 269-276 (1997).

Grama, Sorin, et al., Concentrating Solar Power-Technology, Cost, and Markets, 2008 Industry Report, 2008, 75 pgs. Prometheus Institute for Sustainable Developments and Greetech Media; Part 2.

Harwood, D., et al., Receiver Development for Rooftop Concentrator Applications, International Conference on Solar Concentrators (ICSC-4) 2007, 4 pgs.

Hittite Solar Energy, Pages from http://www.hittitesolarenergy.com, Accessed on Feb. 7, 2003, 6 pp.

Judkins, Zachary S., et al; Performance Results of a Low-Concentration Photocoltaic System Based on High Efficiency Back Contact Cells; 25th European Photovoltaic Solar Energy Conference and Exhibition / 5th World Conference on Photovoltaic Energy Conversion; Sep. 6-10, 2010; pp. 123-12; Valencia Spain.

Kaminar, N.R, et al., PVMaT Improvements in the Manufacturing of the PVI Powergrid, Final Technical Report, Oct. 1999, 77 pgs.

Kempe, M.D., et al., Accelerated Stress Testing of Hydrocarbon-Based Encapsulants for Medium-Concentration CPV Applications, 34th IEEE Photovoltaic Specialists Conference (PVSC), Jun. 7-12, 2009, pp. 1826-1831.

Kennedy, Cheryl, Session CSP Advanced Systems: Optical Materials, 2008 Solar Annual Review Meeting, 27 pgs.

Matios, Laila S. et al., New Module Efficiency Record: 23.5% under 1-Sun Illumination Using Thin-film Single-Junction GaAs Solar Cells; 38th IEEE PVSC Jun. 3-8, 2012; Alta Devices, Inc., Santa Clara, CA USA; pp. 003187-003190.

Le Lievre, Peter, Chromasun Photovoltaic; Heating-Cooling; Daylighting—all in a single panel, Cleantech Showcase Abu Dhabi, Jan. 21, 2009, 21 pages.

Lee, B., et al., Thermally conjunctive and electrically insulating EVA composite encapsulant for solar photovoltaic (PV) cell, Express Polymer Letters, 2008, pp. 357-363, vol. 2, No. 5.

Lerchenmuller, Hansjorg, CPV Super Panel—The CPV Landscape, CPV Today 2nd Concentrated Photovoltaic Summit—US, Feb. 2, 2010, 21 pgs.

Lupfert, Eckhard, Eurotrough Design Issues and Prototype Testing at PSA, Proceedings of the Solar Forum 2001, Solar Energy: The Power to Choose, Apr. 21-25, 2001, 5 pgs.

Mason, N.B. et al., Advanced Laser Processing for Industrial Solar Cell Manufacturing, 2006, 62 pgs, Department of Trade and Industry (United Kingdom).

Mathur, S.S., et al., Geometrical Designs and Performance Analysis of a Linear Fresnel Relector Solar Conentrator With a Flat Horizontal Absorber; International Journal of Energy Research, vol. 14, pp. 107-124; 1990; Jan. 18, 1989, John Wiley & Sons, Ltd.

Meydbray, Y., et al., Solder Joint Degradation in High Efficiently All Back Contact Solar Cells, Proceedings of the 22nd European Photovoltaic Solar Energy Conference, 2007, 5 pgs.

Miller, D.C., et al., Analysis of Transmitted Optical Spectrum Enabling Accelerated Testing of CPV Designs, SPIE 2009 Solar Energy+ Technology Conference, Aug. 2-6, 2009, Jul. 2009 preprint, 15 pgs.

Mirroxx Linear Fresnel Collector Technology (brochure), 2009, 8 pgs.

Morvollo, Pasquale, The ENEA c-Si high efficiency solar cell, Tutorial on PV-Concentrators Technology, 2007, 32 pgs.

Neuhaus, Dirk-Holger, et al., Industrial Silicon Wafer Solar Cells, Advances in OptoElectronics, 2007, pp. 1-15, Hindawi Publishing Corporation.

O'Neill, Mark, Fifth-Generation 20X Linear Fresnel Lens Silicon Cell Concentrator Technology, Fifth International Conference on Solar Concentrators (ICSC-5), Nov. 19, 2008, pp. 1-23.

Plesniak, Adam, Deployment and Performance of Boeing HCPV Modules and Arrays, CPV Today 2nd Concentratec Photovoltaic Summit—US, Feb. 3, 2010, 18 pgs.

Price, Hank, et al., Advances in Parabolic Trough Solar Power Technology, Journal of Solar Energy Engineering, May 2002, pp. 109-125, vol. 124.

Renewable Energy Technology Characterizations, Topical Report TR-109496, Dec. 1997, 283 pgs., Office of Utility Technologies, Energy Efficiency and Renewable Energy, U.S. Department of Energy and Electric Power Research Institute.

Royne, Anja, et al., Cooling of Photovoltaic cells under concentrated illumination: a critical review, Solar Energy Materials & Solar Cells, 2005, pp. 451-483, vol. 86, Elsevier.

Sala, G., et al. 480 kW peak EUCLIDES Concentrator Power Plant Using Parabolic Troughts, 2nd World Conference and Exhibition PVSEC, 1998, pp. 1963-1968.

Chapter 3—History of Concentrators, Jan. 31, 2002, 15 pages.

Creative Materials, "124-08 A/B Electrically Conductive Epoxy Adhesive", www.creativematerials.com, Jan. 22, 2010, Revision: E, 1 page.

Creative Materials, "Product Announcement: Flexible Electrically Conductive Adhesive Family as Solder Replacements in Solar

(56) References Cited

OTHER PUBLICATIONS

Cells", http://www.creativematerials.com/news/pr-conductive-adhesive-for-solar-cells.php, Feb. 9, 2015, 2 pages.

Herrmann, W. et al., "Operational Behaviour of Commercial Solar Cells Under Reverse Biased Conditions", TUV Rheinland Sicherheit und Umweltschutz GmbH, 3 pages.

Skumanich, Andy, CPV: Market Considerations for 2010 and Beyond, CPV Conference Feb. 3, 2010, 31 pgs.

SkyFuel & Sky Trough Questions and Answers (brochure) 2009, 6 pgs., www.SkyFuel.com.

SkyFuel ParabolicTrough Collector Assembly (brochure) 2 pgs., www.SkyFuel.com.

SkyFuel Parabolic Trough Concentrator (brochure) 2009, 2 pgs., www.SkyFuel.com.

Smeltink, J., et al., A hybrid pv-thermal linear microconcentrator for domestic application, 22nd EU PVSEC, 2007, 4 pgs.

Smeltink, J. et al., Performance monitoring of a pv thermal concentrator system, 22nd EU PVSEC, 2007, 4 pgs.

Smeltink, et al., a 40Kw Roof Mounted PV Thermal Concentrator System, 20th EC PV Solar Energy Conference, Mar. 27, 2006, 4 pgs.

Smeltink, et al., 40kW PV Thermal Roof Mounted Concentrator System, Conference System, Conference Record of the 2006 IEEE 4th World Conference on Photovoltaic Energy Conversion, May 2006, pp. 636-639.

Swanson, Richard M., The Promise of Concentrators, Progress in Photovoltaics; Research and Applications, 2000, pp. 93-111, John Wiley & Sons, Ltd.

Tobias, et al., Handbook of Photovoltaic Science and Engineering, Chapter 7—Crystalline Silicon Solar Cells and Modules, 2003, pp. 255-306, 2003 John Wiley & Sonse, Ltd.

U.S. Appl. No. 13/763,412 Office Action dated May 21, 2013.

U.S. Appl. No. 13/763,429 Office Action dated May 23, 2013.

Van Kessel, Theodore, Thermal Management for CPV at 2000 Suns, CPV Today 2nd Concentrated Photovoltaic Summit—US, Feb. 2-3, 2010, 36 pgs.

Weatherby, Clive, Solar CPV—a great opportunity for traditional manufacturing industry, CPV Today Concentrated Photovoltaic Summit USA, Feb. 3-4, 2009, pp. 1-33.

Youssef, Cherif, Utility's Perspective to Concentrated Solar . . . , CPV Today 2nd Annual Concentrated Photovoltaic Summit USA, Feb. 2, 2010, 28 pgs.

Zondag, Herbert, et al. Guidelines for performance measurements of liquid-cooled non-concentrating PVT collectors using c-Si cells, 2006, pp. 1-41, issued by PV Catapult.

U.S. Appl. No. 13/371,790 Office Action dated Feb. 5, 2015, 15 pages.

U.S. Appl. No. 13/371,790 Office Action dated May 1, 2014, 16 pages.

PCT International Search Report corresponding to PCT/US2013/069161, dated May 20, 2014, 6 pages.

Goldberg, Lee H., "Active Bypass Diodes Improve Solar Panel Efficiency and Performance", Digi-Key Corporation, http://www.digikey.com/en/articles/techzone/2012/dec/activebypassdiodesimprovesolarpanelefficiencyandperformance, Dec. 12, 2012, 8 pages.

Chow, T. T., A review on photovoltaic/thermal hybrid solar technology, Applied Energy, Feb. 2010, pp. 365-379, available online Jul. 25, 2009.

\* cited by examiner

HIGH EFFICIENCY CONFIGURATION FOR SOLAR CELL STRING

CROSS REFERENCE TO RELATED APPLICATIONS

This application is a continuation of U.S. patent application Ser. No. 16/112,288 filed Aug. 24, 2018, which is a continuation of U.S. patent application Ser. No. 15/371,677 filed Dec. 7, 2016, which is a continuation of U.S. patent application Ser. No. 13/801,432 filed Mar. 13, 2013. U.S. patent application Ser. No. 13/801,432 is a continuation-in-part of U.S. patent application Ser. No. 13/672,386 filed Nov. 8, 2012, and also claims benefit of priority to U.S. Provisional Application No. 61/734,239 filed Dec. 6, 2012. Each of the patent applications identified in this paragraph is incorporated herein by reference in its entirety.

FIELD OF THE INVENTION

The invention relates generally to solar cells and to their use in concentrating solar energy collectors.

BACKGROUND

Alternate sources of energy are needed to satisfy ever increasing world-wide energy demands. Solar energy resources are sufficient in many geographical regions to satisfy such demands, in part, by provision of electric power generated with solar (e.g., photovoltaic) cells.

SUMMARY

High efficiency arrangements of solar cells are disclosed herein. Solar cells and strings of solar cells as disclosed herein may be particularly valuable in concentrating photovoltaic systems, in which mirrors or lenses concentrate sunlight onto a photovoltaic cell to light intensities greater than one "sun."

In one aspect, a solar cell comprises a silicon semiconductor diode structure having rectangular or substantially rectangular front and back surfaces that have shapes defined by first and second oppositely positioned long sides of the solar cell and two oppositely positioned short sides of the solar cell. In operation, the front surface is to be illuminated by light. The solar cell comprises an electrically conducting front surface metallization pattern disposed on the front surface. This metallization pattern includes a plurality of fingers running parallel to the short sides of the solar cell for substantially the length of the short sides. An electrically conducting back surface metallization pattern is disposed on the back surface.

In some variations, the front surface metallization pattern does not include any bus bar interconnecting the fingers to collect current from the front surface of the solar cell. In such variations, the back surface metallization pattern may lack any contact pad conventionally prepared for solder connections to the solar cell. Alternatively, the back surface metallization pattern may include, for example, a contact pad positioned adjacent to and running parallel to a long side of the solar cell for substantially the length of the long side, or two or more discrete contact pads positioned adjacent to and arranged parallel to the long side.

In some variations, the front surface metallization pattern comprises only a single bus bar, which is positioned adjacent to and runs parallel to the first long side for substantially the length of the first long side. The fingers of the front metallization pattern are attached to and interconnected by the bus bar. In such variations, the back surface metallization pattern may lack any contact pad. Alternatively, the back surface metallization pattern may include, for example, a contact pad positioned adjacent to and running parallel to the second long side for substantially the length of the second long side, or two or more discrete contact pads positioned adjacent to and arranged parallel to the second long side. These contact pads may have widths measured perpendicular to the long sides that approximately match the width of the bus bar, for example. In any of these variations the front surface metallization pattern may include a bypass conductor that has a width perpendicular to its long axis narrower than the width of the bus bar and that interconnects two or more fingers to provide multiple current paths from each of the two or more interconnected fingers to the bus bar. The bypass conductor may be positioned adjacent to and run parallel to the bus bar, for example.

In some variations, the front surface metallization pattern comprises two or more discrete contact pads positioned adjacent to the first long side. Each of the fingers of the front metallization pattern is attached and electrically connected to at least one of the contact pads. In such variations, the back surface metallization pattern may lack any contact pad. Alternatively, the back surface metallization pattern may include, for example, a contact pad positioned adjacent to and running parallel to the second long side for substantially the length of the second long side, or two or more discrete contact pads positioned adjacent to and arranged parallel to the second long side. These contact pads may have widths measured perpendicular to the long sides that approximately match the width of the contact pads in the front surface metallization pattern, for example. In any of these variations the front surface metallization pattern may include a bypass conductor that has a width perpendicular to its long axis narrower than the widths of the front surface metallization contact pads and that interconnects two or more fingers to provide multiple current paths from each of the two or more interconnected fingers to one or more of the contact pads.

In any of the above variations, the solar cell may comprise any suitable silicon semiconductor diode structure. For example, the solar cell may comprise a heterojunction with intrinsic thin layer (HIT) structure.

In any of the above variations, the ratio of the length of a long side of the solar cell to the length of a short side of the solar cell may be greater than or equal to about three, for example.

A concentrating solar energy collector may comprise the solar cell of any of the above variations and one or more optical elements arranged to concentrate solar radiation onto the solar cell.

In another aspect, a string of solar cells comprises at least a first silicon solar cell and a second silicon solar cell. The first silicon solar cell comprises a front surface to be illuminated by light, a back surface, and an electrically conducting front surface metallization pattern disposed on the front surface. The second silicon solar cell comprises a front surface to be illuminated by light, a back surface, and an electrically conductive back surface metallization pattern disposed on the back surface. The first and second silicon solar cells are positioned with an edge of the back surface of the second silicon solar cell overlapping an edge of the front surface of the first silicon solar cell. A portion of the front surface metallization pattern of the first silicon solar cell is hidden by the second silicon solar cell and bonded to a portion of the back surface metallization pattern of the second silicon solar cell with an electrically conductive bonding material to electrically connect the first and second silicon solar cells in series.

Either or both of the first and second silicon solar cells may be, for example, any of the variations of the silicon solar cell summarized above. In such variations, the overlapping edges of the silicon solar cells may be defined by long sides of the solar cells, for example, and the edges may be arranged parallel to each other. If the front surface metallization pattern of the first silicon solar cell includes a bypass conductor, the bypass conductor may either be hidden, or not hidden, by the second silicon solar cell.

The first and second silicon solar cells may be bonded to each other at the overlapping portions of the solar cells with an electrically conductive solder. As an alternative to solder, the solar cells may instead be bonded to each other with, for example, an electrically conductive film, an electrically conductive paste, an electrically conductive epoxy (e.g., an electrically conductive silver-filled epoxy), an electrically conductive tape, or another suitable electrically conductive adhesive. These alternatives to solder may be selected, for example, to provide more mechanical compliance than would be provided by an electrically conductive solder bond. The electrically conductive bonding material bonding the solar cells to each other may also interconnect fingers of the front surface metallization pattern to perform the current collecting function of a bus bar. The front surface metallization pattern on the solar cells may thus lack any such bus bar.

A concentrating solar energy collector may comprise the string of solar cells of any of the above variations and one or more optical elements arranged to concentrate solar radiation onto the string.

In another aspect, a solar energy receiver comprises a metal substrate and a series-connected string of two or more solar cells disposed on the metal substrate with ends of adjacent solar cells overlapping in a shingle pattern. Adjacent overlapping pairs of solar cells may be electrically connected in a region where they overlap by an electrically conducting bond between the front surface of one of the solar cells and the back surface of the other solar cell. The electrically conducting bond may be between a metallization pattern on the front surface of one solar cell and a metallization pattern on the back surface of the other solar cell, for example. The solar cells may be, for example, silicon solar cells, including any of the variations of the silicon solar cells summarized above or any of the variations of the back-contact silicon solar cells described below, or solar cells similarly configured to any of those variations but utilizing another material system other than or in addition to silicon. The electrically conducting bond between the solar cells may be formed, for example, by any of the methods summarized above. The solar cells may be disposed in a lamination stack that adheres to the metal substrate, for example.

In some variations, the metal substrate is linearly elongated, each of the solar cells is linearly elongated, and the string of solar cells is arranged in a row along a long axis of the metal substrate with long axes of the solar cells oriented perpendicular to the long axis of the metal substrate. This row of solar cells may be the only row of solar cells on the substrate.

In some variations, the series-connected string of solar cells is a first string of solar cells, and the solar energy receiver comprises a second series-connected string of two or more solar cells arranged with ends of adjacent solar cells overlapping in a shingle pattern. The second string of solar cells is also disposed on the metal substrate. A mechanically compliant electrical interconnect may electrically couple the back surface of a solar cell at an end of the first string of solar cells to the front surface of a solar cell at an end of the second string of solar cells. The interconnection may be between a metallization pattern on the front surface of one solar cell and a metallization pattern on the back surface of the other solar cell, for example. The solar cell at the end of the first string of solar cells may overlap the solar cell at the end of the second string of solar cells and hide the mechanically compliant electrical interconnect from view from the front (illuminated) surface side of the solar cells. In such variations, the metal substrate may be linearly elongated, each of the solar cells may be linearly elongated, and the first and second strings of solar cells may be arranged in line in a row along a long axis of the metal substrate with long axes of the solar cells oriented perpendicularly to the long axis of the metal substrate.

A concentrating solar energy collector may comprise the solar energy receiver of any of the above variations and one or more optical elements arranged to concentrate solar radiation onto the receiver.

In another aspect, a string of solar cells comprises a first group of solar cells arranged with ends of adjacent solar cells overlapping in a shingle pattern and connected in series by electrical connections between solar cells made in the overlapping regions of adjacent solar cells, a second group of solar cells arranged with ends of adjacent solar cells overlapping in a shingle pattern and connected in series by electrical connections between solar cells made in the overlapping regions of adjacent solar cells, and a mechanically compliant electrical interconnect electrically coupling the first group of solar cells to the second group of solar cells in series. The mechanically compliant electrical interconnect may electrically couple the back surface of a solar cell at an end of the first group of solar cells to a front surface of a solar cell at an end of the second group of solar cells, for example. The interconnection may be between a metallization pattern on the front surface of one solar cell and a metallization pattern on the back surface of the other solar cell, for example. The mechanically compliant electrical interconnect may be bonded to the solar cells with electrically conducting bonds made by any of the methods summarized above, for example.

The solar cells may be, for example, silicon solar cells, including any of the variations of the silicon solar cells summarized above or any of the variations of the back-contact silicon solar cells described below, or solar cells similarly configured to any of those variations but utilizing another material system other than or in addition to silicon. The electrical connections between overlapping solar cells may be made, for example, with electrically conducting bonds made by any of the methods summarized above.

The first and second groups of solar cells may be arranged in line in a single row. In such variations, a gap between the two groups of solar cells where they are interconnected by the mechanically compliant electrical interconnect may have a width less than or equal to about five millimeters, for example. Also in such variations, the mechanically compliant electrical interconnect may comprise a metal ribbon oriented perpendicularly to a long axis of the row of solar cells and electrically coupled to a back surface on a solar cell at an end of the first group of solar cells and to a front surface on a solar cell at an end of the second group of solar cells.

The mechanically compliant electrical interconnect in any of the above variations may comprise a metal ribbon patterned with slits or openings, for example, to increase its mechanical compliance.

In any of the above variations, the solar cell at the end of the first group of solar cells may overlap the solar cell at the end of the second group of solar cells and hide the mechanically compliant electrical interconnect from view from the front surface side of the string of solar cells.

A concentrating solar energy collector may comprise the string of solar cells of any of the above variations and one or more optical elements arranged to concentrate solar radiation onto the string.

In another aspect, a string of solar cells comprises at least a first solar cell and a second solar cell. The first solar cell comprises a front surface to be illuminated by light, a back surface, and (optionally) an electrically conducting front surface metallization pattern disposed on the front surface. The second solar cell comprises a front surface to be illuminated by light, a back surface, and an electrically conductive back surface metallization pattern disposed on the back surface. The string of solar cells also comprises at least a first mechanically compliant electrical interconnect. The first and second solar cells are positioned with an edge of the back surface of the second solar cell overlapping an edge of the front surface of the first solar cell. The mechanically compliant electrical interconnect is bonded to a portion of the front surface of the first solar cell that is hidden by the second solar cell and bonded to a portion of the back surface of the second solar cell to electrically connect the first and second solar cells in series. In this arrangement the second solar cell hides the mechanically compliant electrical interconnect from view from the front surface side of the first solar cell. The interconnection may be between a metallization pattern on the front surface of one solar cell and a metallization pattern on the back surface of the other solar cell, for example.

Either or both of the first and second solar cells may be, for example, any of the variations of the silicon solar cells summarized above or any of the variations of the back-contact silicon solar cells described below, or solar cells similarly configured to any of those variations but utilizing another material system other than or in addition to silicon. In such variations, the overlapping edges of the solar cells may be defined by long sides of the solar cells, for example, and the edges may be arranged parallel to each other. If the first solar cell comprises a front surface metallization pattern that includes a bypass conductor, the bypass conductor may either be hidden, or not hidden, by the second solar cell.

The mechanically compliant electrical interconnect may be bonded to the solar cells with electrically conducting bonds made by any of the methods summarized above, for example. The electrically conductive bonds may interconnect fingers of a front surface metallization pattern on the first solar cell, if present, to perform the current collecting function of a bus bar. A front surface metallization pattern on the solar cell may thus lack any such bus bar.

The mechanically compliant electrical interconnect may comprise, for example, a flat metal ribbon, a bent metal ribbon, or a metal ribbon bent to form a loop. The mechanically compliant electrical interconnect may comprise a metal ribbon patterned to increase its mechanical compliance.

The string of solar cells may comprise a second mechanically compliant electrical interconnect and a third solar cell having a front surface to be illuminated by light, a back surface, and an electrically conducting back surface metallization pattern disposed on the back surface. The second and third solar cells are positioned with an edge of the back surface of the third solar cell overlapping an edge of the front surface of the second silicon solar cell. The mechanically compliant electrical interconnect is bonded to a portion of the front surface of the second solar cell that is hidden by the third solar cell and bonded to a portion of the back surface of the third solar cell to electrically connect the second and third solar cells in series. The interconnection may be between a metallization pattern on the front surface of the second solar cell and a metallization pattern on the back surface of the third solar cell, for example. The mechanically compliant electrical interconnect may be bonded to the solar cells with electrically conducting bonds made by any of the methods summarized above, for example. The electrically conductive bonds may interconnect fingers of a front surface metallization pattern of the second solar cell to perform the current collecting function of a bus bar. A front surface metallization pattern on the solar cell may thus lack any such bus bar.

A concentrating solar energy collector may comprise the string of solar cells of any of the above variations and one or more optical elements arranged to concentrate solar radiation onto the string.

In another aspect, a solar energy receiver comprises a substrate, a thermally conductive encapsulant layer adhering to the substrate, a string of solar cells disposed on the thermally conductive encapsulant layer, a clear encapsulant layer disposed on the string of solar cells, and a clear top sheet disposed on the clear encapsulant layer. The thermally conductive encapsulant layer comprises pigments. The solar cells may be, for example, any of the variations of the silicon solar cells summarized above or any of the variations of the back-contact silicon solar cells described below, or solar cells similarly configured to any of those variations but utilizing another material system other than or in addition to silicon.

The thermally conductive encapsulant layer may reflect a substantial portion of solar radiation incident on it. In such variations, the thermally conductive encapsulant layer may be white, for example. Further, in such variations the solar cells may be HIT solar cells, with the reflective encapsulant layer arranged to reflect toward the HIT cell solar radiation that passed unabsorbed through the HIT cell to the reflective layer. Alternatively, the thermally conductive encapsulant layer may absorb a substantial portion of solar radiation incident on it. In such variations, the thermally conductive encapsulant layer may be black, for example. The clear top sheet may have a moisture transmission rate of less than or equal to about 0.01 grams per meter-day, for example. The string of solar cells may comprise a plurality of solar cells arranged with ends of adjacent solar cells overlapping in a shingle pattern.

A concentrating solar energy collector may comprise the solar energy receiver of any of the above variations and one or more optical elements arranged to concentrate solar radiation onto the receiver.

In another aspect, a back-contact silicon solar cell comprises a front surface to be illuminated by light, a back surface, one or more n-contacts on the back surface that electrically contact an n-conductivity type side of a silicon diode junction, one or more p-contacts on the back surface that electrically contact a p-conductivity type side of the silicon diode junction, and one or more electrically conducting vias. The electrically conducting vias pass through the solar cell from the back surface to the front surface to provide near an edge of the front surface one or more electrical connections to either the p-contacts or the n-contacts.

The front and back surfaces may have corresponding rectangular or substantially rectangular shapes defined by two oppositely positioned long sides and two oppositely positioned short sides, with upper ends of the vias arranged along a long side of the front surface. In some such variations, the n-contacts comprise a plurality of n-fingers arranged side-by-side and running parallel to the short sides of the back surface, the p-contacts comprise a plurality of p-fingers arranged side-by-side and running parallel to the short sides of the back surface, and the n-fingers and the p-fingers are interdigitated. In other variations, the n-contacts comprise a plurality of n-fingers arranged side-by-side and running parallel to each other at an angle to the short sides of the back surface such that opposite ends of each n-finger are offset in a direction parallel to the long sides by a distance equal to a pitch distance between n-fingers, the p-contacts comprise a plurality of p-fingers arranged side-by-side and running parallel to each other at an angle to the short sides of the back surface such that opposite ends of each p-finger are offset in a direction parallel to the long sides by a distance equal to a pitch distance between p-fingers, and the n-fingers and the p-fingers are interdigitated.

In other variations, upper ends of the vias may be arranged along a short side of the front surface, and the n-fingers and p-fingers may be similarly configured to as summarized above except for running parallel to, or at an angle to, the long sides of the back surface. In yet other variations the back-contact solar cell may be substantially square, with vias and fingers arranged similarly to as summarized above and running parallel to or at an angle to one pair of sides of the solar cell.

In any of the above variations, the back contact solar cell may comprise a bus bar or a plurality of contact pads on the front surface that electrically interconnect upper ends of the vias.

A concentrating solar energy collector may comprise the back-contact solar cell of any of the above variations and one or more optical elements arranged to concentrate solar radiation onto the solar cell.

In another aspect, a string of solar cells comprises a first back-contact silicon solar cell comprising a front surface to be illuminated by light, a back surface, one or more n-contacts on the back surface that electrically contact an n-conductivity type side of a diode junction, one or more p-contacts on the back surface that electrically contact a p-conductivity type side of the diode junction, and a second back-contact silicon solar cell comprising a front surface to be illuminated by light, a back surface, one or more n-contacts on the back surface that electrically contact an n-conductivity type side of a diode junction, and one or more p-contacts on the back surface that electrically contact a p-conductivity type side of the diode junction. The first and second back-contact silicon solar cells are positioned with an edge of the back surface of the second back-contact silicon solar cell overlapping an edge of the front surface of the first back-contact silicon solar cell and electrically connected in series.

The back-contact silicon solar cells may be, for example, any of the variations of back-contact silicon solar cells summarized above.

In some variations, the first back-contact silicon solar cell comprises one or more electrically conducting vias that pass through the solar cell from its back surface to its front surface to electrically interconnect either the p-contacts or the n-contacts of the first back-contact silicon solar cell to contacts of opposite polarity on the back surface of the second back-contact silicon solar cell. Upper ends of the conducting vias may be located, for example, in a region of the front surface of the first back-contact silicon solar cell that is overlapped by the second back-contact silicon solar cell. The conducting vias may be electrically connected to the contacts on the back surface of the second silicon solar cell by one or more electrically conductive bonds between the front surface of the first back-contact silicon solar cell and the back surface of the second back-contact silicon solar cell. The electrically conductive bonds may be made by any of the methods summarized above, for example. The first back-contact silicon solar cell may optionally comprise a bus bar or a plurality of contact pads on its front surface that electrically interconnect upper ends of the vias to each other, and that are electrically connected to the contacts on the back surface of the second back-contact silicon solar cell by the one or more electrically conductive bonds.

In other variations, a mechanically compliant electrical interconnect electrically connects either the p-contacts or the n-contacts on the back surface of the first back-contact silicon solar cell to electrical contacts of opposite polarity on the back surface of the second back-contact silicon solar cell. The mechanically compliant electrical interconnect may be bonded to the solar cells with electrically conducting bonds made by any of the methods summarized above, for example.

A concentrating solar energy collector may comprising the string of solar cells of any of the variations described above and one or more optical elements arranged to concentrate solar radiation onto the solar cell.

In another aspect, a solar energy receiver comprises a substrate, and a series-connected string of two or more solar cells disposed on the substrate with ends of adjacent solar cells overlapping in a shingle pattern. The linear coefficient of thermal expansion of the solar cells differs from that of the substrate by greater than or equal to about $5 \times 10^{-6}$, or by greater than or equal to about $10 \times 10^{-6}$, or by greater than or equal to about $15 \times 10^{-6}$, or by greater than or equal to about $20 \times 10^{-6}$.

The solar cells may be silicon solar cells, for example. The solar cells may be, for example, any of the variations of silicon solar cells summarized above, including variations of HIT and back-contact silicon solar cells, or solar cells similarly configured to any of those variations but utilizing another material system other than or in addition to silicon.

Adjacent overlapping pairs of solar cells in the string may be electrically connected in series in a region where they overlap by an electrically conducting bond between a front surface of one of the solar cells and a back surface of the other solar cell. Such electrically conducting bonds may be formed by any of the methods summarized above, for example. Alternatively, adjacent overlapping pairs of solar cells may be electrically connected in series in a region where they overlap by a mechanically compliant electrical interconnect between a front surface of one of the solar cells and a back surface of the other solar cell. The mechanically compliant electrical interconnects may be bonded to the solar cells with electrically conducting bonds made by any of the methods summarized above, for example.

The substrate may be a metal substrate, for example. The substrate may be an aluminum substrate, for example.

In some variations, the metal substrate is linearly elongated, each of the solar cells is linearly elongated, and the string of solar cells is arranged in a row along a long axis of the substrate with long axes of the solar cells oriented perpendicular to the long axis of the substrate. In such variations the string of solar cells may be a first string of solar cells, and the solar energy receiver may also comprise a second series-connected string of two or more solar cells disposed on the substrate with ends of adjacent solar cells overlapping in a shingle pattern, and a mechanically compliant electrical interconnect that electrically connects the first and second strings in series. The linear coefficient of thermal expansion of solar cells in the second string may also differ from that of the substrate by greater than or equal to about $5 \times 10^{-6}$, or by greater than or equal to about $10 \times 10^{-6}$, or by greater than or equal to about $15 \times 10^{-6}$, or by greater than or equal to about $20 \times 10^{-6}$. The second string may be positioned in line with the first string. Overlapping pairs of solar cells in the second string may be bonded to each other or otherwise interconnected as summarized above for the first string, for example.

A concentrating solar energy collector may comprise the solar energy receiver of any of the variations summarized above and one or more optical elements arranged to concentrate solar radiation onto the receiver.

In another aspect, a method of laminating solar cells to a substrate comprises arranging a plurality of solar cells to form a series-connected string of solar cells with ends of adjacent solar cells overlapping in a shingle pattern, disposing the string of solar cells in a stack of layers on the substrate, and applying a pressure not greater than about 0.6 atmospheres to force the stack of layers and the substrate together. The pressure may be, for example, less than or equal to about 0.4 atmospheres. The pressure may be, for example, between about 0.2 and about 0.6 atmospheres. The method may comprise heating the substrate, the stack of layers, or the substrate and the stack of layers to a temperature of between about 130° C. and about 160° C. while applying the pressure. This method may be used with any of the variations of solar cells, and any of the variations of series-connected strings of overlapping solar cells, summarized above.

In another aspect, a method of preparing a string of solar cells comprises arranging a plurality of solar cells with ends of adjacent solar cells overlapping in a shingled manner and with an uncured electrically conductive epoxy disposed between overlapped portions of adjacent solar cells in locations selected to series-connect the solar cells. The method also comprises applying a pressure to force overlapping ends of the solar cells against each other while elevating a temperature of the solar cells to cure the electrically conductive epoxy to form electrically conductive bonds between the solar cells. In some variations, after the electrically conductive epoxy is cured, the string of solar cells is disposed in a stack of layers on a substrate that is then laminated to the substrate. In other variations, the string of solar cells is disposed in a stack of layers on a substrate before the electrically conductive epoxy is cured. The stack is then laminated to the substrate. The electrically conductive epoxy is cured (under pressure) during the lamination process. This method may be used with any of the variations of solar cells summarized above.

In any of the strings of overlapping solar cells summarized above, the amount of overlap between adjacent solar cells may vary along the string so that the size of the area of the front surface of each solar cell that is not overlapped by an adjacent solar cell varies through the string in a manner that matches the electrical performance of the solar cells. For example, the different sizes of illuminated (i.e., not overlapped) area for each solar cell may be selected to compensate for inherent performance differences between the cells to thereby match the current output by each cell when under equal illumination.

Any of the strings of overlapping solar cells summarized above may be positioned for operation in a solar energy collector with the string oriented so that for each solar cell that has a portion of its front surface overlapped by another solar cell, the overlapped front surface portion is closer to the earth's equator than is the uncovered front surface portion. With the string in this orientation, exposed edges of the upper overlapping solar cells are oriented away from the earth's equator.

Any of the variations of silicon solar cells summarized above may be formed from or comprise, for example, mono-crystalline or poly-crystalline silicon.

These and other embodiments, features and advantages of the present invention will become more apparent to those skilled in the art when taken with reference to the following more detailed description of the invention in conjunction with the accompanying drawings that are first briefly described.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention. This description will clearly enable one skilled in the art to make and use the invention, and describes several embodiments, adaptations, variations, alternatives and uses of the invention, including what is presently believed to be the best mode of carrying out the invention.

As used in this specification and the appended claims, the singular forms "a," "an," and "the" include plural referents unless the context clearly indicates otherwise. Also, the term "parallel" is intended to mean "parallel or substantially parallel" and to encompass minor deviations from parallel geometries rather than to require that any parallel arrangements described herein be exactly parallel. The term "perpendicular" is intended to mean "perpendicular or substantially perpendicular" and to encompass minor deviations from perpendicular geometries rather than to require that any perpendicular arrangement described herein be exactly perpendicular.

This specification discloses high efficiency configurations for solar cell strings as well as solar cells (e.g., photovoltaic cells), and electrically conductive interconnects for solar cells, that may be used in such strings. As further described below, the high efficiency configuration strings may be advantageously employed in concentrating solar energy collectors in which solar radiation is concentrated onto the solar cells with reflectors, lenses, or other optical components. Such collectors may concentrate light onto the solar cells to provide illumination greater than or equal to about seven "suns", for example.

Figure 1A:
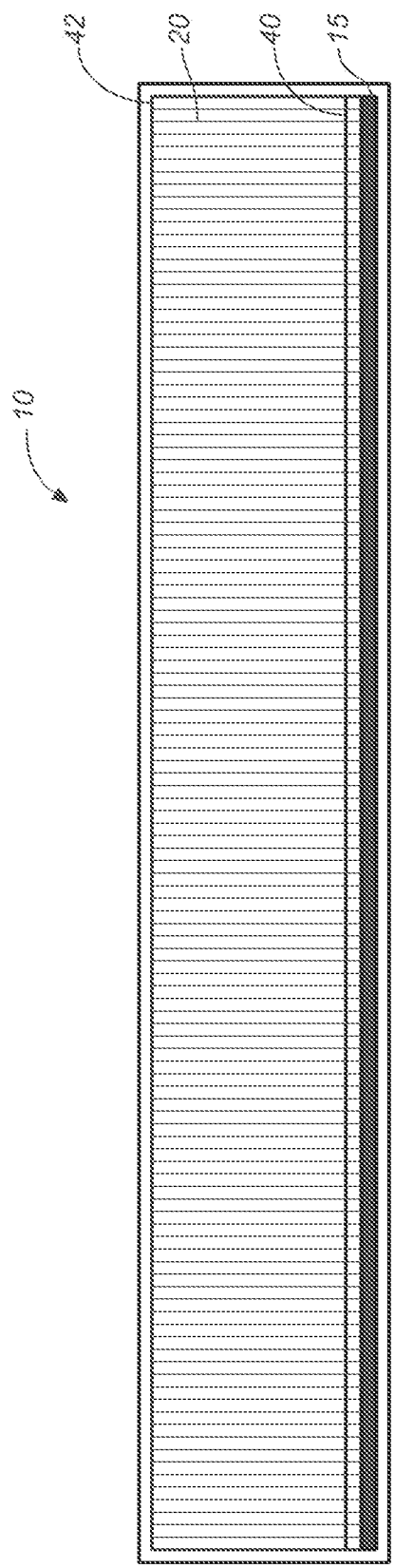
FIG. 1A shows a schematic diagram of an example front surface metallization pattern for a solar cell.

FIG. 1A shows a schematic diagram of an electrically conducting front surface metallization pattern on the front surface of an example solar cell 10. The front surface of solar cell 10 is rectangular or substantially rectangular. Other shapes may also be used, as suitable. The front surface metallization pattern includes a bus bar 15 positioned adjacent to the edge of one of the long sides of solar cell 10 and running parallel to the long sides for substantially the length of the long sides, and fingers 20 attached perpendicularly to the bus bar and running parallel to each other and to the short sides of solar cell 10 for substantially the length of the short sides.

Solar cell 10 comprises a semiconductor diode structure on which the front surface metallization pattern is disposed. A back surface metallization pattern is disposed on a back surface of solar cell 10 as shown, for example, in FIG. 1B and described further below. The semiconductor structure may be, for example, a conventional crystalline silicon diode structure comprising an n-p junction, with the top semiconductor layer on which the front surface metallization is disposed being, for example, of either n-type or p-type conductivity. Any other suitable semiconductor diode structure in any other suitable material system may also be used.

Figure 1B:
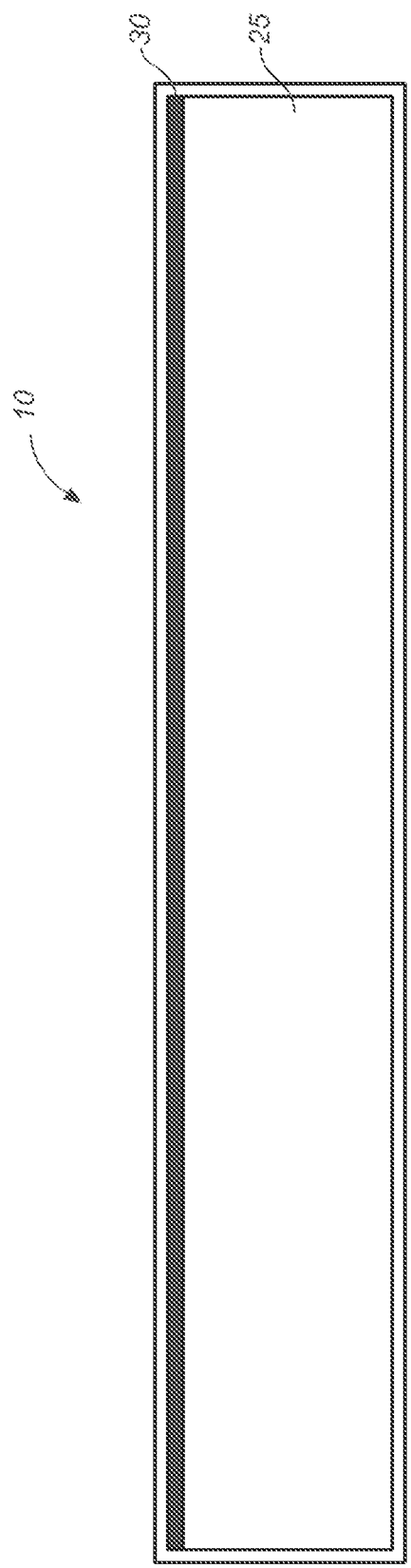
FIG. 1B shows a schematic diagram of an example back surface metallization pattern that may be used, for example, for a solar cell having the front surface metallization pattern of FIG. 1A.

Referring now to FIG. 1B, an electrically conducting back surface metallization pattern on the back surface of solar cell 10 comprises back contact 25, and back contact pad 30 positioned adjacent to the edge of one of the long sides of solar cell 10 and running parallel to the long sides for substantially the length of the long sides. FIG. 1B shows the back side of solar cell 10 as if it were viewed through the front surface of solar cell 10. As shown by a comparison of FIG. 1A and FIG. 1B, back contact pad 30 and front surface bus bar 15 are positioned along opposite long sides of solar cell 10.

The front and back surface metallization patterns on solar cell 10 provide electric contacts to the semiconductor diode structure by which electric current generated in solar cell 10 when it is illuminated by light may be provided to an external load. In addition, the illustrated front and back surface metallization patterns allow two such solar cells 10 to be positioned in an overlapping geometry with their long sides parallel to each other and with the back contact pad 30 of one of the solar cells overlapping and physically and electrically connected to the front surface bus bar 15 of the other solar cell. As further described below, this pattern may be continued, in a manner similar to shingling a roof, to construct a string of two or more overlapping solar cells 10 electrically connected in series. Such an arrangement is referred to below as, for example, series-connected overlapping solar cells.

In the illustrated example solar cell 10 has a length of about 156 millimeters (mm), a width of about 26 mm, and thus an aspect ratio (length of short side/length of long side) of about 1:6. Six such solar cells may be prepared on a standard 156 mm×156 mm dimension silicon wafer, then separated (diced) to provide solar cells as illustrated. In other variations, eight solar cells 10 having dimensions of about 19.5 mm×156 mm, and thus an aspect ratio of about 1:8, may be prepared from a standard silicon wafer. More generally, solar cells 10 may have aspect ratios of, for example, about 1:3 to about 1:20 and may be prepared from standard size wafers or from wafers of any other suitable dimensions. As further explained below, solar cells having long and narrow aspect ratios, as illustrated, may be advantageously employed in concentrating photovoltaic solar energy collectors in which solar radiation is concentrated onto the solar cells.

Referring again to FIG. 1A, in the illustrated example the front surface metallization pattern on solar cell 10 also comprises an optional bypass conductor 40 running parallel to and spaced apart from bus bar 15. Bypass conductor 40 interconnects fingers 20 to electrically bypass cracks that may form between bus bar 15 and bypass conductor 40. Such cracks, which may sever fingers 20 at locations near to bus bar 15, may otherwise isolate regions of solar cell 10 from bus bar 15. The bypass conductor provides an alternative electrical path between such severed fingers and the bus bar. A bypass conductor 40 may have a width, for example, of less than or equal to about 1 mm, less than or equal to about 0.5 mm, or between about 0.05 mm and about 0.5 mm. The illustrated example shows a bypass conductor 40 positioned parallel to bus bar 15, extending about the full length of the bus bar, and interconnecting every finger 20. This arrangement may be preferred but is not required. If present, the bypass conductor need not run parallel to the bus bar and need not extend the full length of the bus bar. Further, a bypass conductor interconnects at least two fingers, but need not interconnect all fingers. Two or more short bypass conductors may be used in place of a longer bypass conductor, for example. Any suitable arrangement of bypass conductors may be used. The use of such bypass conductors is described in greater detail in U.S. patent application Ser. No. 13/371,790, titled "Solar Cell With Metallization Compensating For Or Preventing Cracking," and filed Feb. 13, 2012, which is incorporated herein by reference in its entirety.

The example front surface metallization pattern of FIG. 1A also includes an optional end conductor 42 that interconnects fingers 20 at their far ends, opposite from bus bar 15. The width of conductor 42 may be about the same as that of a finger 20, for example. Conductor 42 interconnects fingers 20 to electrically bypass cracks that may form between bypass conductor 40 and conductor 42, and thereby provides a current path to bus bar 15 for regions of solar cell 10 that might otherwise be electrically isolated by such cracks.

Bus bar 15, fingers 20, bypass conductor 40 (if present), and end conductor 42 (if present) of the front surface metallization pattern may be formed, for example, from silver paste conventionally used for such purposes and deposited, for example, by conventional screen printing methods. Alternatively, these features may be formed from electroplated copper. Any other suitable materials and processes may be also used. Bus bar 15 may have a width perpendicular to its long axis of, for example, less than or equal to about 3 mm, and in the illustrated example has a width of about 1.5 mm. Fingers 20 may have widths, for example, of about 10 microns to about 100 microns. In the illustrated example, the front surface metallization pattern includes about 125 fingers spaced evenly along the ~154 mm length of bus bar 15. Other variations may employ, for example, less than about 125, about 150, about 175, about 200, about 225, about 125 to about 225, or more than about 225 fingers spaced evenly along a bus bar 15 of about the same (~154 mm) length. Generally, the width of the bus bar and the width, number, and spacing of the fingers may be varied depending on the intensity of solar radiation to be concentrated on the solar cell. Typically, higher concentrations of solar radiation on the solar cell require more and/or wider fingers to accommodate the resulting higher current generated in the solar cell. In some variations, the fingers may have widths that are greater near the bus bar than they are away from the bus bar.

Referring again to the example back surface metallization pattern shown in FIG. 1B, back contact 25 may be a conventionally deposited aluminum contact, for example, and may substantially cover the back surface of solar cell 10. Alternatively, back contact 25 may leave islands or other portions of the back surface of solar cell 10 unmetallized. As yet another alternative, back contact 25 may comprise fingers similar to those in the front surface metallization pattern, running parallel to each other and to the short sides of solar cell 10 for substantially the length of the short sides. Any other suitable configuration for back contact 25 may also be used. Back contact pad 30 may be formed, for example, from silver paste conventionally used for such purposes and deposited, for example, by conventional screen printing methods. Alternatively, contact 25 and/or back contact pad 30 may be formed from electroplated copper. Any other suitable materials and processes may also be used to form back contact 25 and back contact pad 30. Back contact pad 30 may have a width perpendicular to its long axis of, for example, less than or equal to about 3 mm, and in the illustrated example has a width of about 2 mm. Back contact pad 30 may have a width, for example, matching or approximately matching the width of front bus bar 15. In such instances back contact pad 30 may have a width, for example, of about 1 to about 3 times the width of bus bar 15.

Solar cells 10 may be HIT (heterojunction with intrinsic thin layer) silicon solar cells. In such cases, the HIT cells may employ, for example, the front surface metallization patterns described above with respect to FIG. 1A or any variations of those front surface metallization pattern described herein. The HIT cells may employ, for example, the back surface metallization patterns described above with respect to FIG. 1B or any variations of those back surface metallization patterns described herein. The HIT cell back surface metallization pattern may comprise fingers (e.g., silver fingers) similar to those in the front surface metallization pattern of FIG. 1A. In such cases the fingers of the back surface metallization pattern may be disposed on a layer of transparent conducting oxide (TCO), which in turn is disposed on the back surface of the semiconductor diode structure. Alternatively, the back surface metallization pattern for HIT cells may comprise a thin copper layer disposed on a TCO layer, which is in turn disposed on a back surface of the semiconductor diode structure. The copper layer may be deposited by electroplating, for example. The TCO in this or the previous variation may be or comprise indium tin oxide, for example. Any other suitable back surface metallization pattern may also be used.

For HIT cells employed in solar cell strings as described herein, a thin copper layer back surface metallization pattern may handle high current density with low resistance and therefore results in low $I^2R$ loss at the back contact. Light passing unabsorbed through the HIT cell is typically is typically absorbed by the copper layer, however, leading to optical loss. HIT cells in which the back surface metallization pattern comprises fingers deposited on a TCO layer may be positioned with their back surfaces on or above a reflecting surface, such as a white surface. Light which passes unabsorbed through the HIT cell may thereby be reflected back into the HIT cell, past the fingers and through the TCO, to be absorbed in the HIT cell and generate additional current. The $I^2R$ loss in the fingers may be greater than that for the thin copper layer back surface metallization variation, however. The choice of back surface metallization pattern generally depends on which such pattern performs best when the HIT cells are illuminated at a desired level of concentration (e.g., at greater than or equal to about seven "suns").

Figure 2:
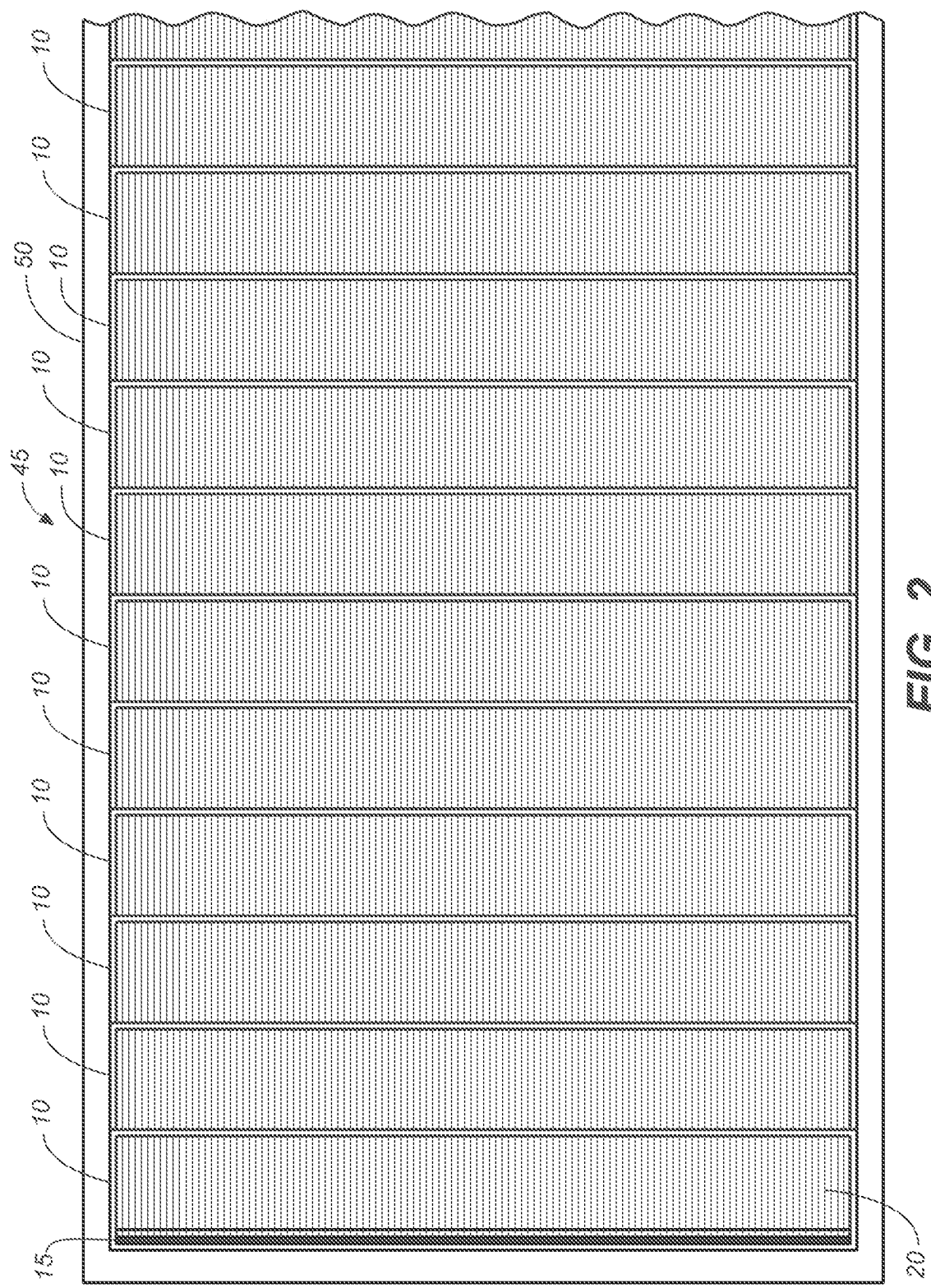
FIG. 2 shows a fragmentary view schematically illustrating one end of an example solar energy receiver that comprises a string of series-connected solar cells arranged in an overlapping manner on a linearly elongated substrate. Each solar cell has the front surface metallization pattern illustrated in FIG. 1A.
Figure 3A:
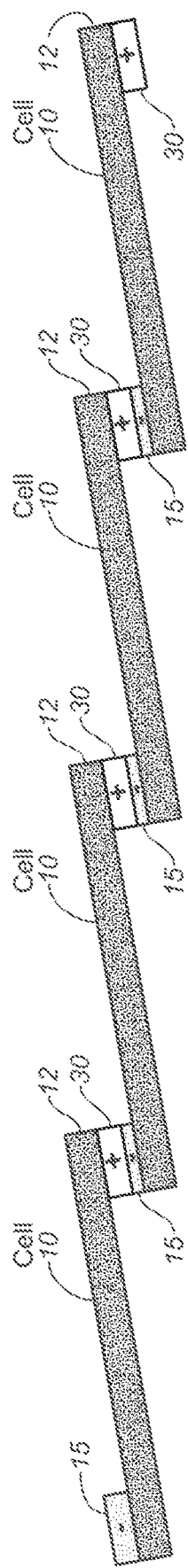
FIG. 3A shows a schematic cross-sectional diagram illustrating the overlap of adjacent solar cells in the string of solar cells shown in FIG. 2.

Referring now to FIG. 2, an example solar energy receiver 45 comprises a string of series-connected solar cells 10 arranged in an overlapping manner on a linearly elongated substrate 50. Each solar cell 10 in solar energy receiver 45 has the front and back surface metallization patterns illustrated in FIGS. 1A and 1B, respectively. FIG. 3A shows a cross-sectional view illustrating the overlap of adjacent solar cells in solar energy receiver 45. As shown in FIG. 3A, for each pair of overlapping solar cells the bottom contact pad 30 of one solar cell overlaps the front surface bus bar 15 of the other solar cell. Exposed front surface bus bar 15 at one end of the string and exposed bottom contact pad 30 at the other end of the string may be used to electrically connect the string to other electrical components as desired. In the example illustrated in FIG. 2, bypass conductors 40 are hidden by overlapping portions of adjacent cells. Alternatively, solar cells comprising bypass conductors 40 may be overlapped similarly to as shown in FIG. 2 and FIG. 3A without covering the bypass conductors.

Front surface bus bar 15 and bottom contact pad 30 of an overlapping pair of solar cells 10 may be bonded to each other using any suitable electrically conductive bonding material. Suitable conductive bonding materials may include, for example, conventional electrically conductive reflowed solder, and electrically conductive adhesives. Suitable electrically conductive adhesives may include, for example, interconnect pastes, conductive films, and anisotropic conductive films available from Hitachi Chemical and other suppliers, as well as electrically conductive tapes available from Adhesives Research Inc., of Glen Rock Pa., and other suppliers. Suitable electrically conductive adhesives may also include silver-filled conductive epoxies or other conductive epoxies. In some variations such electrically conductive adhesives may be selected, for example, to remain flexible over a temperature range between about −40° C. and about 115° C., have an electrical resistivity less than or equal to about 0.04 ohm-centimeters, exhibit elongation at break greater than or equal to about 20%, have a dispensable viscosity, or have any combination of the preceding characteristics.

The illustration of FIG. 3A labels front bus bars 15 with a minus sign (−), and bottom contact pads 30 with a plus sign (+), to indicate electrical contact to n-type and p-type conductivity layers in the solar cell, respectively. This labeling is not intended to be limiting. As noted above, solar cells 10 may have any suitable diode structure.

Referring again to FIG. 2, substrate 50 of solar energy receiver 45 may be, for example, an aluminum or other metal substrate, a glass substrate, or a substrate formed from any other suitable material. Solar cells 10 may be attached to substrate 50 in any suitable manner. For example, solar cells 10 may be laminated to an aluminum or other metal substrate 50 with intervening adhesive, encapsulant, and/or electrically insulating layers disposed between solar cells 10 and the surface of the metal substrate. Substrate 50 may optionally comprise channels through which a liquid may be flowed to extract heat from solar energy receiver 45 and thereby cool solar cells 10, in which case substrate 50 may preferably be an extruded metal substrate. Solar energy receiver 45 may employ, for example, lamination structures, substrate configurations, and other receiver components or features as disclosed in U.S. patent application Ser. No. 12/622,416, titled "Receiver for Concentrating Solar Photovoltaic-Thermal System", and filed Nov. 19, 2009, which is incorporated herein by reference in its entirety. Although in the illustrated example substrate 50 is linearly elongated, any other suitable shape for substrate 50 may also be used.

Receiver 45 may include only a single row of solar cells running along its length, as shown in FIG. 2. Alternatively, receiver 45 may include two or more parallel rows of solar cells running along its length.

Strings of overlapping series-connected solar cells as disclosed herein, and linearly elongated receivers including such strings, may be used, for example, in solar energy collectors that concentrate solar radiation to a linear focus along the length of the receiver, parallel to the string of solar cells. Concentrating solar energy collectors that may advantageously employ strings of series-connected overlapping solar cells as disclosed herein may include, for example, the solar energy collectors disclosed in U.S. patent application Ser. No. 12/781,706 titled "Concentrating Solar Energy Collector" and filed May 17, 2010, and the solar energy collectors disclosed in U.S. patent application Ser. No. 13/740,770 titled "Concentrating Solar Energy Collector" and filed Jan. 14, 2013. Each of these patent applications is incorporated herein by reference in its entirety. Such concentrating solar energy collectors may, for example, employ long narrow flat mirrors arranged to approximate a parabolic trough that concentrates solar radiation to a linear focus on the receiver.

Referring again to FIGS. 1A and 1B, although the illustrated examples show front bus bar 15 and back contact pad 30 each extending substantially the length of the long sides of solar cell 10 with uniform widths, this may be advantageous but is not required. For example, front bus bar 15 may be replaced by two or more discrete contact pads which may be arranged, for example, in line with each other along a side of solar cell 10. Such discrete contact pads may optionally be interconnected by thinner conductors running between them. There may be a separate (e.g., small) contact pad for each finger in the front surface metallization pattern, or each contact pad may be connected to two or more fingers. Back contact pad 30 may similarly be replaced by two or more discrete contact pads. Front bus bar 15 may be continuous as shown in FIG. 1A, and back contact pad 30 formed from discrete contact pads as just described. Alternatively, front bus bar 15 may be formed from discrete contact pads, and back contact pad 30 formed as shown in FIG. 1B. As yet another alternative, both of front bus bar 15 and back contact pad 30 may be replaced by two or more discrete contact pads. In these variations, the current-collecting functions that would otherwise be performed by front bus bar 15, back contact pad 30, or by front bus bar 15 and back contact pad 30 may instead be performed, or partially performed, by the conductive material used to bond two solar cells 10 to each other in the overlapping configuration described above.

Although FIG. 1B and FIG. 3A show back contact pad 30 located adjacent a long edge of the back surface of solar cell 10, contact pad 30 may have any suitable location on the back surface of the solar cell. For example, FIGS. 6A-6C, 7B, and 8B, further described below, show example solar cells 10 that each have a contact pad 30 located near the center of the back surface of the solar cell and running parallel to the solar cell's long axis.

Further, solar cell 10 may lack front bus bar 15 and include only fingers 20 in the front surface metallization pattern, or lack back contact pad 30 and include only contact 25 in the back surface metallization pattern, or lack front bus bar 15 and lack back contact pad 30. In these variations as well, the current-collecting functions that would otherwise be performed by front bus bar 15, back contact pad 30, or front bus bar 15 and back contact pad 30 may instead be performed by the conductive material used to bond two solar cells 10 to each other in the overlapping configuration described above.

Solar cells lacking bus bar 15, or having bus bar 15 replaced by discrete contact pads, may either include bypass conductor 40, or not include bypass conductor 40. If bus bar 15 is absent, bypass conductor 40 may be arranged to bypasses cracks that form between the bypass conductor and the portion of the front surface metallization pattern that is conductively bonded to the overlapping solar cell.

To this point solar cells 10 have been described as having front and back surface metallization patterns that provide electrical contact to opposite sides of a diode junction. Alternatively, solar cells 10 may be back-contact solar cells in which one set of contacts on the back surface of the solar cell electrically contacts one side of the diode junction, and another set of contacts on the back surface of the solar cell electrically contacts the other side of the diode junction. When such solar cells are deployed conventionally, typically no electrical contact is made to the front surface of the solar cells. This back-contact geometry advantageously increases the amount of light incident on active portions of the solar cell by eliminating front surface metallization that would block light. Such back-contact solar cells are available, for example, from SunPower Inc.

When used in shingled strings of solar cells as described herein, such a back-contact solar cell may further include conducting vias that pass through the solar cell from its back surface to its front surface to provide, at an edge of the front surface, one or more electrical connections to one side of the diode junction. When the solar cell is arranged in a shingled manner with an adjacent similarly configured solar cell, the front surface electrical connections at the edge of one cell overlap with and may be electrically connected to back surface contacts on the other cell to electrically connect the two overlapped back-contact solar cells in series.

Figure 1C:
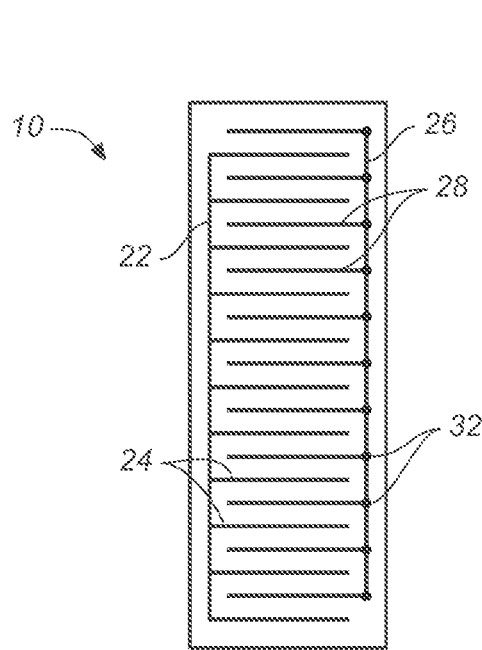
FIG. 1C shows a schematic diagram of an example back surface metallization pattern for a back contact solar cell in which contacts to both sides of the diode junction are made on the back surface and in which vias pass through the cell from the back surface to the front surface to provide electrical connection at an edge of the front surface to one side of the diode junction.
Figure 1D:
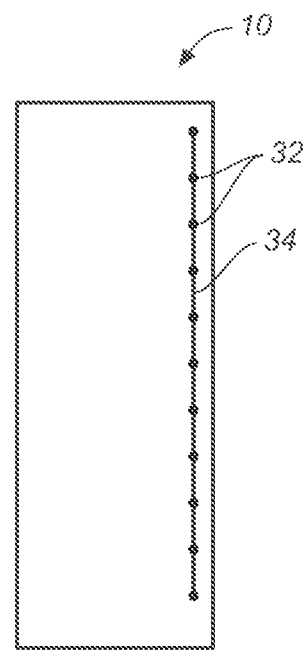
FIG. 1D shows an example front surface metallization pattern for a back contact solar cell in which vias pass through the cell from the back surface to the front surface to provide electrical connections from one side of the diode junction to a bus bar along an edge of the front surface.
Figure 1E:
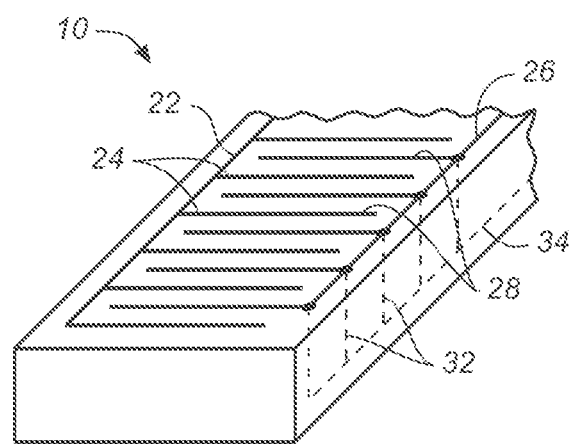
FIG. 1E shows a perspective view of an example back contact solar cell employing the example front surface and back surface metallization patterns of FIG. 1C and FIG. 1D, respectively.

FIGS. 1C-1E schematically depict an example all-back-contact solar cell 10 configured for use in a series-connected string of overlapping (i.e., shingled) solar cells. The example back surface metallization pattern shown in FIG. 1C and FIG. 1E includes an optional p-line 22 running parallel to and adjacent to a long side of the solar cell, a plurality of p-fingers 24 connected to the p-line and running parallel to the short sides of the solar cell, an optional n-line 26 running parallel to and adjacent to the other long side of the solar cell, and a plurality of n-fingers 28 connected to the n-line, running parallel to the short sides of the solar cell, and interdigitated with p-fingers 24. The regions of the semiconductor structure beneath and contacted by the n-fingers and the p-fingers are correspondingly doped n-type or p-type to form a diode junction.

As seen in FIG. 1C-1E, the example back-contact solar cell 10 also includes conducting vias 32 that pass through solar cell 10 to provide electrical contact from n-line 26 and n-fingers 28 on the back surface of solar cell 10 to an optional bus bar 34 that runs parallel to and adjacent to a long side of the solar cell on the front surface of the solar cell. FIG. 1D depicts the front surface of the solar cell 10 as if that front surface were viewed through the back surface of the solar cells. As shown by a comparison of Figures 1C-1E, in the illustrated example bus bar 32 and n-line 26 are positioned along the same long side of the solar cell, with p-line 22 positioned along the opposite long side. Solar cells configured in this manner may be positioned with the p-line 22 on the back surface of one solar cell overlapping and electrically connected to the bus bar on the front surface of an adjacent solar cell to connect the solar cells in series. In this arrangement bus bar 34 is covered by an active portion of the overlapping solar cell. Thus there is no exposed front surface metallization blocking light from active regions of the solar cell.

Alternatively, the polarities n and p in the above description may be swapped so that vias 32 provide electrical contact from p-contacts on the back surface of solar cell 10 to bus bar 34 on the front surface. Solar cells configured in this manner may be positioned with the n-line on the back surface of one solar cell overlapping and electrically connected to the bus bar on the front surface of an adjacent solar cell to connect the two solar cells in series.

Although the illustrated examples show one via for each finger on the back surface that is to be electrically connected to the front surface, there may be more or fewer vias than fingers so long as the fingers to be connected to the front surface are interconnected on the back surface in such a manner that each is electrically connected to one or more vias. Though bus bar 34 is shown as extending substantially the length of the long sides of solar cell 10 with uniform width, this may be advantageous but is not required. For example, bus bar 34 may be replaced by two or more discrete contact pads which may be arranged, for example, in line with each other along a side of solar cell 10. Such discrete contact pads may optionally be interconnected by thinner conductors running between them. There may be a separate (e.g., small) contact pad on the front surface for each via, or each contact pad may be connected to two or more vias. Bus bar 34 may also be absent. P-line 22 and/or n-line 26 may similarly be replaced by two or more discrete contact pads, or may be absent. Some variations lack a bus bar 34 at the front surface end of the vias, or lack an interconnecting conductor such as a p-line or an n-line at the back surface end of the vias, or lack a bus bar 34 at the upper surface end of the vias and also lack an interconnecting conductor at the back surface end of the vias. In variations in which bus bar 34, p-line 22, and/or n-line 26 are formed from discrete contact pads or are absent, the current-collecting functions that would otherwise be performed by these features may instead be performed, or partially performed, by conductive material used to bond two solar cells together in the overlapping configuration described above.

Figure 1F:
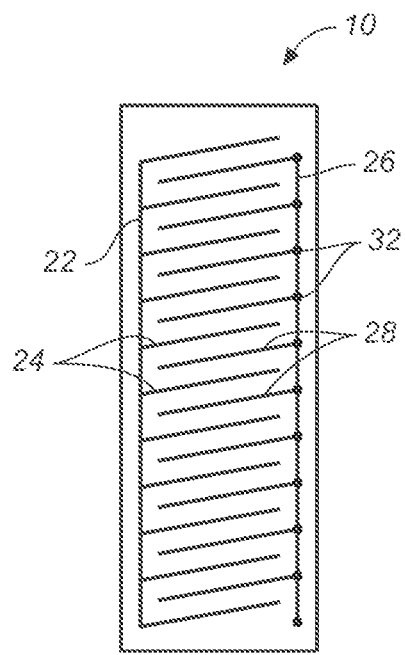
FIG. 1F shows another example back surface metallization pattern for a back contact solar cell in which contacts to both sides of the diode junction are made on the back surface and in which vias pass through the cell from the back surface to the front surface to provide electrical connection at an edge of the front surface to one side of the diode junction.

To shorten the current path between overlapped back contact solar cells through the vias described above, it may be desirable to configure and/or arrange the solar cells so that each via is aligned at one end with the end of a (n or p) finger on the back surface of one solar cell and aligned at its other end with the end of a (p or n) finger of opposite polarity on the back surface of an adjacent overlapped solar cell. With fingers configured as shown in FIG. 1C, the vias may be aligned in this manner by positioning the overlapped solar cells so that one is translated with respect to the other along their overlapping long sides by a distance equal to the pitch between fingers. Alternatively, the fingers may be configured as shown in FIG. 1F, for example, so that they extend at an angle across the solar cell back surface such that opposite ends of each finger are offset along the long sides of the solar cell by a distance equal to the pitch between fingers. Solar cells configured in this manner may be overlapped with their short sides flush to provide the desired via alignment with fingers on the overlapped solar cells. Although FIG. 1F shows the back surface metallization pattern including p-line 22 and n-line 26, either or both may be absent.

Vias 32 may thus interconnect two overlapped back-contact solar cells finger to finger, finger to line (e.g., bus bar, p-line, or n-line), or line to line, for example.

The formation of vias 32 may be integrated into the conventional manufacturing processes for all-back-contact solar cells. Holes for the vias may be formed, for example, by conventional laser drilling and may be filled, for example, with any suitable conventional conducting material deposited by any suitable conventional method. The conducting material may be an electroplated metal or a printed conductive metal paste, for example.

Figure 3B:
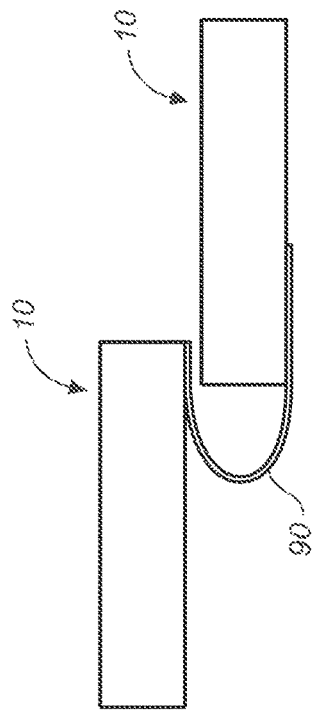
FIG. 3B shows a schematic cross-sectional diagram illustrating the overlap of adjacent back contact solar cells, with an electrical interconnection between the back surfaces of overlapping solar cells made with a flexible electrical interconnect.

Back-contact solar cells may also be employed in series-connected overlapped strings of solar cells without the use of the vias described above. Referring to the cross-sectional view of FIG. 3B, for example, two such overlapped back-contact solar cells may be electrically connected in series by a mechanically compliant electrical interconnect 90 which interconnects a back contact on one of the solar cells and a back contact of opposite polarity on the other solar cell.

The strings of overlapping series-connected solar cells disclosed herein, and linearly elongated receivers including such strings, may operate with higher efficiency than conventional arrangements, particularly under concentrated illumination. In some variations, the strings of overlapping solar cells disclosed herein may provide, for example, ≥15% more output power than analogous conventionally arranged strings of solar cells.

Dicing a wafer to provide solar cells having smaller areas reduces the current "I" generated in the solar cells and can thereby reduce "$I^2R$" power losses that result from resistance "R" internal to the solar cells and resistance in connections between the solar cells in a string. However, conventional strings of series-connected solar cells require gaps between adjacent solar cells. For a string of a given physical length, the number of such gaps increases as the solar cells are made shorter. Each gap reduces the power generated by the string, thereby at least partially defeating the advantage that might otherwise result from using solar cells of smaller areas. Further, the power loss resulting from the gaps increases when such a conventional string is employed in a concentrating solar energy collector.

In contrast to conventional strings of solar cells, the strings of series-connected overlapping solar cells disclosed herein do not have gaps between solar cells. The solar cells in such strings may therefore be diced into smaller areas to reduce $I^2R$ losses without accumulating power losses due to gaps. For example, it may be advantageous to use solar cells having a longest side that has a length that spans a standard wafer, as in solar cells 10 depicted in the various figures herein, because such solar cells may be oriented with their longest sides perpendicular to the long axis of the string to provide a wider focal region in a linear focus concentrating solar energy collector. (Making the focal region wider relaxes tolerances on optical elements in the concentrating solar energy collector, and may facilitate advantageous use of flat mirrors). For conventional strings of solar cells, the optimal length of the short side of the solar cells would then be determined in part by a trade-off between $I^2R$ power losses and losses due to gaps between cells. For the strings of overlapping solar cells disclosed herein, the length of the short sides of the solar cells (and thus the areas of the solar cells) may be selected to reduce $I^2R$ losses to a desired level without concern for losses due to gaps.

Conventional solar cells typically employ two or more parallel front surface bus bars which shade the underlying portions of the solar cells and thus reduce the power generated by each solar cell. This problem is exacerbated by the copper ribbons, typically wider than the bus bars, which are used in conventional strings to electrically connect the front surface bus bars of a solar cell to the back surface contact of an adjacent solar cell in the string. The copper ribbons in such conventional strings typically run across the front surface of the solar cells, parallel to the string and overlying the bus bars. The power losses that result from shading by the bus bars and by the copper ribbons increase when such conventional solar cells are employed in a concentrating solar energy collector. In contrast, the solar cells disclosed herein may employ only a single bus bar on their front surfaces, as illustrated, or no bus bar, and do not require copper ribbons running across the illuminated front surface of the solar cells. Further, in strings of overlapping solar cells as disclosed herein, the front surface bus bar on each solar cell, if present, may be hidden by active surface area of an overlapping solar cell, except at one end of the string. The solar cells and strings of solar cells disclosed herein may thus significantly reduce losses due to shading of underlying portions of the solar cells by the front surface metallization, compared to conventional configurations.

One component of $I^2R$ power losses is due to the current paths through the fingers in the front surface metallization. In conventionally arranged strings of solar cells, the bus bars on the front surfaces of solar cells are oriented parallel to the length of the string, and the fingers are oriented perpendicularly to the length of the string. Current within a solar cell in such a conventional string flows primarily perpendicularly to the length of the string along the fingers to reach the bus bars. The finger lengths required in such geometries may be sufficiently long to result in significant $I^2R$ power losses in the fingers. In contrast, the fingers in the front surface metallization of solar cells disclosed herein are oriented parallel to the short sides of the solar cells and parallel to the length of the string, and current in a solar cell flows primarily parallel to the length of the string along the fingers. The finger lengths required in this arrangement may be shorter than required for conventional cells, thus reducing power losses.

Another component of $I^2R$ power losses is due to the length of the current path between adjacent solar cells through the conventional copper ribbon interconnects. The current paths between adjacent solar cells in the overlapping configurations disclosed herein may be shorter than in conventional arrangements, thus reducing $I^2R$ losses.

The solar cell metallization patterns and/or overlapping cell geometries disclosed herein may be advantageously used with crystalline silicon solar cells disposed on a metal substrate, as in receiver 45 of FIG. 2, for example. One of ordinary skill in the art may find this surprising, however. If formed using conventional reflowed solder, for example, the bond between the front surface bus bar and the back surface contact pad of overlapping solar cells in a string as disclosed herein may be significantly more rigid than the electrical connections between adjacent solar cells provided by copper ribbon tabbing in conventionally tabbed strings of solar cells. Consequently, in comparison to copper ribbon tabbing, the solder connections between adjacent solar cells in such a string may provide significantly less strain relief to accommodate mismatch between the coefficient of thermal expansion (CTE) of the silicon solar cells and that of the metal substrate. That mismatch may be quite large. For example, crystalline silicon has a CTE of ~3×10', and aluminum has a CTE of ~23×10$^6$. One of ordinary skill in the art may therefore expect such strings of overlapping silicon solar cells disposed on a metal substrate to fail through cracking of the silicon solar cells. This expectation would be even stronger for such strings of overlapping solar cells employed in a concentrating solar energy collector in which they may cycle over larger temperature ranges, and therefore experience greater strain from thermal expansion mismatch with the substrate, than typically experienced in a non-concentrating solar energy collector.

Contrary to such expectations, however, the inventors have determined that strings of series-connected overlapping silicon solar cells may be bonded to each other with conventional reflowed solder, attached to an aluminum or other metal substrate, and reliably operated under concentrated solar radiation. Such strings may have a length, for example, of greater than or equal to about 120 mm, greater than or equal to about 200 mm, greater than or equal to about 300 mm, greater than or equal to about 400 mm, or greater than or equal to about 500 mm, or between about 120 mm and about 500 mm.

Further, the inventors have also determined that solder substitutes such as those described above, including electrically conducting tapes, conductive films, interconnect pastes, conductive epoxies (e.g., silver-filled conductive epoxies), and other similar conducting adhesives, for example, may be used to bond solar cells to each other to form even longer strings of series-connected overlapping solar cells on a metal substrate. In such variations the conductive bonding material that bonds overlapping cells together is selected to be mechanically compliant, by which it is meant that the bonding material is easily elastically deformed-springy. (Mechanical compliance is the inverse of stiffness). In particular, the conductive bonds between solar cells in such strings are selected to be more mechanically compliant than solar cells 10, and more mechanically compliant than conventional reflowed solder connections that might otherwise be used between overlapping solar cells. Such mechanically compliant conductive bonds between overlapping solar cells deform without cracking, detaching from the adjacent solar cells, or otherwise failing under strain resulting from thermal expansion mismatch between solar cells 10 and substrate 50. The mechanically compliant bonds may therefore provide strain relief to a string of interconnected overlapping solar cells, thereby accommodating CTE mismatch between solar cells 10 and substrate 50 and preventing the string from failing. The difference between the CTE of the (e.g., silicon) solar cell and the substrate may be, for example, greater than or equal to about $5\times10^6$, greater than or equal to about $10\times10^6$, greater than or equal to about $15\times10'$, or greater than or equal to about $20\times10$. Such strings of series-connected overlapping silicon solar cells disposed on a substrate with mismatched CTEs may have a length, for example, greater than or equal to about 1 meter, greater than or equal to about 2 meters, or greater than or equal to about 3 meters.

Figure 4:
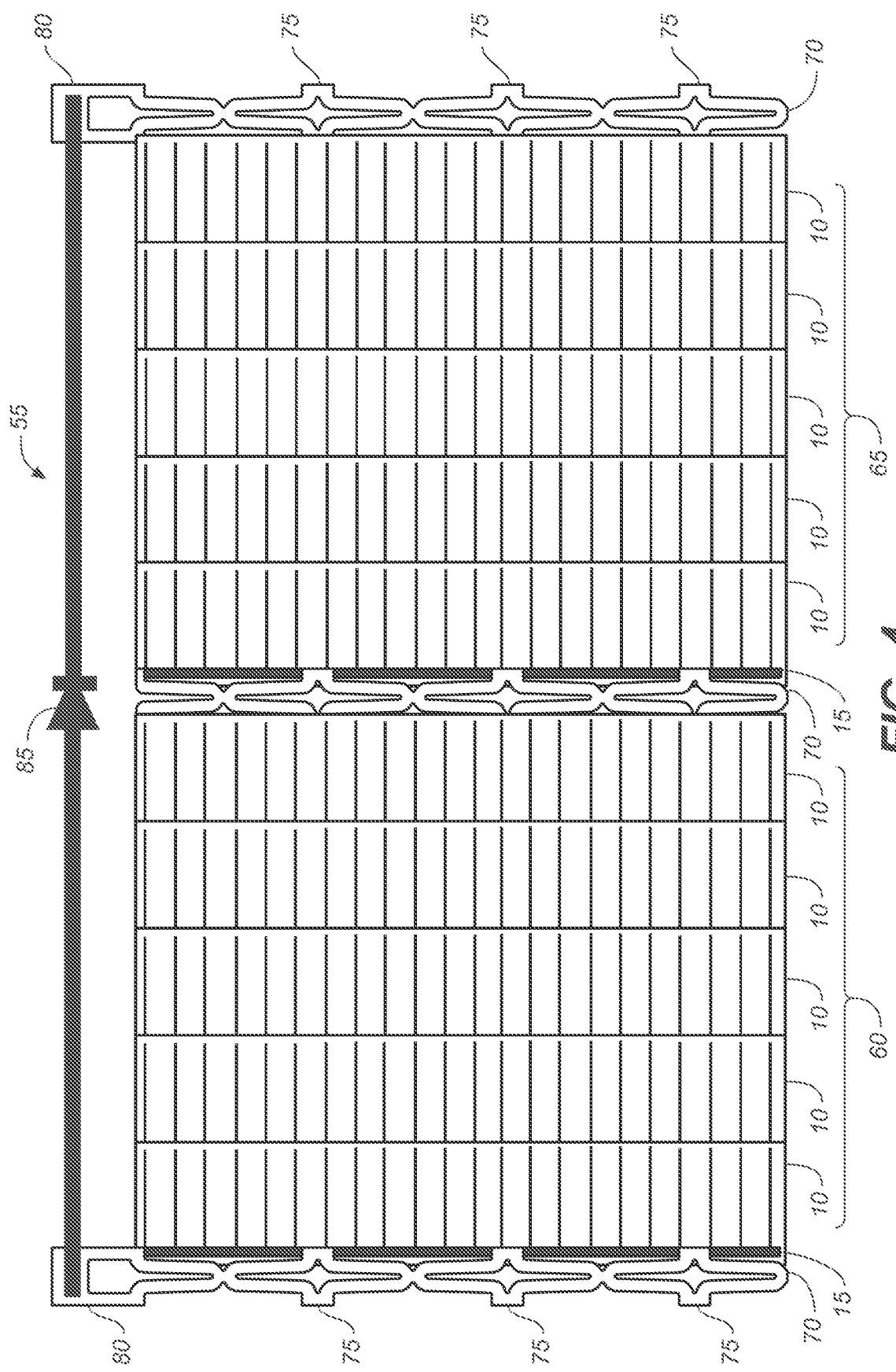
FIG. 4 shows a schematic diagram of an example string of solar cells including a first group of overlapped solar cells electrically connected to a second group of overlapped solar cells by an electrically conductive mechanically compliant interconnect.

Further still, the inventors have developed mechanically compliant electrical interconnects that may be used to interconnect two or more strings of series-connected overlapping solar cells to form longer strings of series-connected solar cells. The resulting longer strings may be disposed on a metal substrate or other substrate and reliably operated under concentrated solar radiation. Referring now to FIG. 4, an example string 55 of series connected solar cells comprises a first group 60 of series-connected overlapping solar cells 10 that is electrically and physically connected to a second group 65 of series-connected overlapping solar cells 10 by a mechanically compliant electrically conductive interconnect 70. Additional such interconnects 70 are located at the ends of string 55 to allow additional groups of series-connected overlapping solar cells to be added to either end of string 55 to extend the length of the string. Alternatively, interconnects 70 located at the ends of a string may be used to connect the string to other electrical components or to an external load. Overlapping solar cells within groups 60 and 65 may be bonded to each other with electrically conductive reflowed solder or with electrically conductive adhesives, as described above, or in any other suitable manner.

The spacing between the adjacent ends of two groups of series-connected overlapping solar cells 10 interconnected with a mechanically compliant interconnect 70 may be, for example, less than or equal to about 0.2 mm, less than or equal to about 0.5 mm, less than or equal to about 1 mm, less than or equal to about 2 mm, less than or equal to about 3 mm, less than or equal to about 4 mm, or less than or equal to about 5 mm.

Figure 5A:
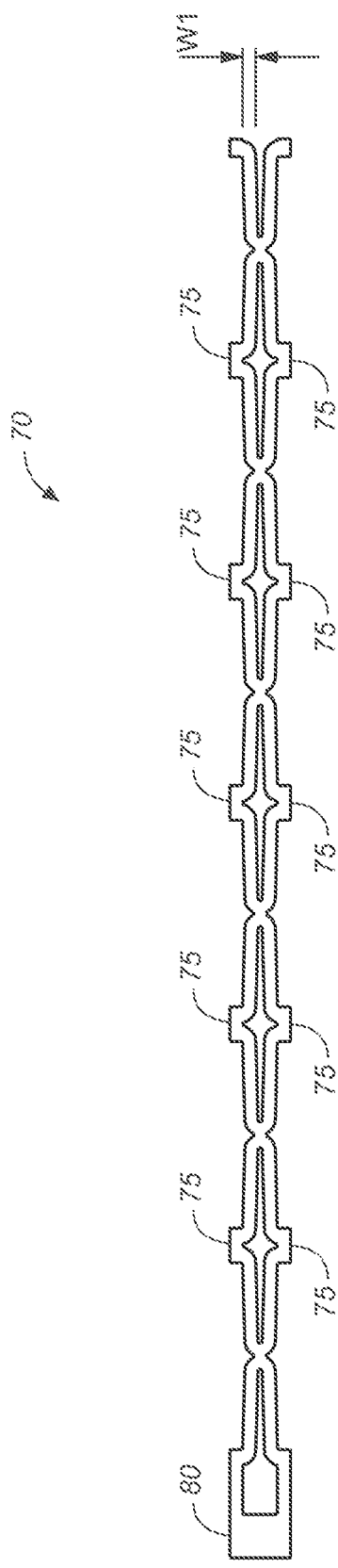
FIG. 5A shows a schematic diagram of the example mechanically compliant interconnect used in the string of solar cells illustrated in FIG. 4.
Figure 5B:
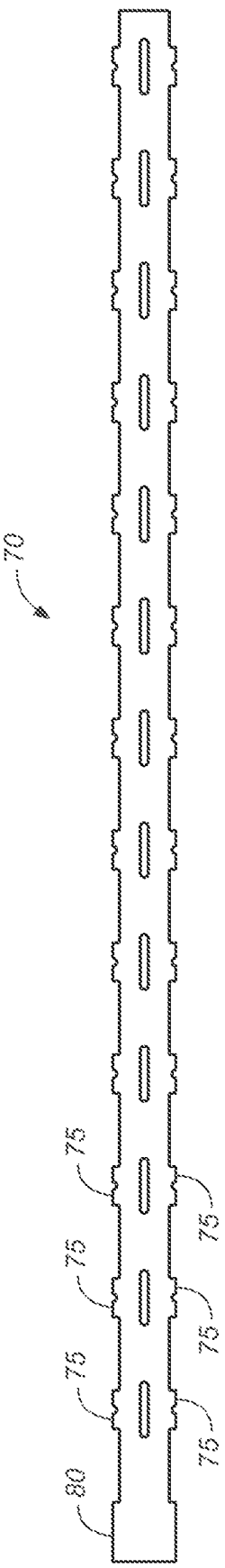
FIG. 5B shows a schematic diagram of another example mechanically compliant interconnect that may be used, for example, in place of the interconnect shown in FIG. 5A.

The variation of mechanically compliant electrical interconnect shown in FIG. 4 is also shown, in more detail, in FIG. 5A. Another variation of mechanically compliant electrical interconnect 70 having similar features is shown in FIG. 5B. Referring now to FIG. 5A and FIG. 5B as well as to FIG. 4, the example mechanically compliant electrical interconnects 70 are ribbon-like and have a long and narrow aspect ratio with a length approximately equal to or greater than the length of the long sides of solar cells 10. Each interconnect 70 comprises two sets of tabs 75, with each set of tabs positioned on an opposite side of the long axis of the interconnect. As shown in FIG. 4, an interconnect 70 may be positioned between two strings of series-connected overlapping solar cells with its tabs 75 on one side making electrical contact to the bus bar 15 on the front surface of an end solar cell of one string of overlapping solar cells, and with its tabs 75 on the other side making electrical contact to contact pad 30 on the back surface of an end cell of the other string of overlapping solar cells. Tabs 75 may be attached to bus bar 15 or to contact pad 30 with conventional electrically conductive solder, electrically conductive adhesives as described above, or by any other suitable method.

In the example of FIG. 4, interconnects 70 at the end of string 55 also each include a bypass diode tap 80 at one end, in addition to tabs 75. Bypass diode taps 80 provide connection points for bypass diodes. In the illustrated example, bypass diode 85 is configured to bypass both groups of series-connected overlapping solar cells in the event that a solar cell in string 55 fails. Alternatively, interconnects 70 having bypass diode taps 80 may be used at any desired interval in a string to bypass one, two, or more groups of series-connected overlapping solar cells. The maximum number of solar cells that may be arranged to be bypassed by a bypass diode is determined by the performance characteristics of the bypass diode. The bypass diodes may be configured to bypass, for example, approximately 25 solar cells 10, which may be distributed in any desired number of series-connected groups of series-connected overlapping solar cells. For example, each bypass diode may b configured to bypass about 25 solar cells, all of which are part of a single group of series-connected overlapping solar cells. Although in the illustrated example the bypass diode is connected to the string with interconnects 70, alternative configurations may also be used. For example, bypass diodes may be connected to the string by a conductor (other than an interconnect 70) that is electrically connected to the bottom metallization pattern of one solar cell, and by another conductor (other than an interconnect 70) that is electrically connected to a bus bar on the front surface of another solar cell. Such connections may be made to solar cells that are not at the end of a group of series-connected overlapping solar cells, but instead somewhere in between.

Figure 11:
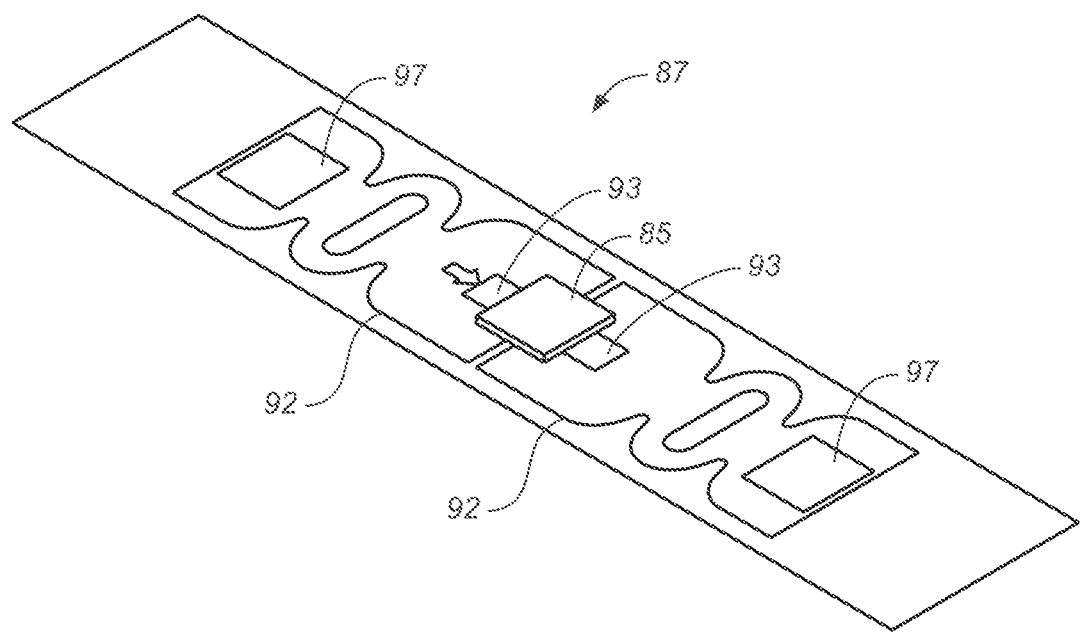
FIG. 11 shows a schematic diagram of an example bypass diode flex circuit that may be employed, for example, with shingled solar cells as described in this specification.

Referring now to FIG. 11, bypass diode 85 may be mounted to a flex circuit 87 comprising two physically separated electrical contacts 92 sandwiched between two insulating sheets. The insulating sheets are patterned to expose adjacent regions 93 of the two contacts to which the diode is attached to electrically interconnect the contacts, and to expose regions 97 of the contacts allowing the flex circuit to be electrically connected to bypass a portion of the solar cell string. Each of contacts 92 is shaped or patterned to increase its mechanical compliance. In particular, contacts 92 include narrow necks and oval-shaped regions which make the contacts very compliant. Contacts 92 may be formed, for example, from solder-coated metal (e.g., copper) ribbon. The insulating sheets may be formed, for example, from a polyimide. Flex circuit 87 may comprise in addition a bottom adhesive layer by which it may be attached to a substrate supporting a string of solar cells.

Referring again to FIG. 4, FIG. 5A, and FIG. 5B, interconnects 70 are mechanically compliant. In particular, they are more mechanically compliant than solar cells 10 and more mechanically compliant than solder connections between bus bar 15 and back contact pad 30 of overlapping solar cells 10. Interconnects 70 may also be more mechanically compliant than bonds between overlapping solar cells formed from electrically conductive adhesives as described above. Interconnects 70 deform without cracking, detaching from the adjacent solar cells, or otherwise failing under strain resulting from thermal expansion mismatch between solar cells 10 and substrate 50. Interconnects 70 may therefore provide strain relief to a string of interconnected groups of overlapping solar cells, thereby accommodating the thermal expansion mismatch between solar cells 10 and substrate 50 and preventing the string from failing.

In the illustrated examples each interconnect 70 is a solder-coated metal (e.g., copper) ribbon that has been shaped or patterned to enhance its mechanical compliance. In particular, the illustrated interconnect 70 of FIG. 5A includes a central portion having the form of a series of two or more flattened ovals interlinked at their ends. Each flattened oval includes a pair of tabs 75 on opposite flattened sides of the oval, to make contact with solar cells as described above. The flattened ovals make each interconnect 70 very compliant ("springy") in directions parallel and perpendicular to the long axis of the interconnect. In the illustrated example, the strips of metal forming the walls of the ovals have a width W1 of approximately 1.5 mm, but any suitable width may be used. The illustrated interconnect 70 of FIG. 5B includes a series of slots running down the center of the metal ribbon parallel to its long axis. The slots make the interconnect of this variation very compliant, as well. Interconnects 70 may be formed from highly conductive materials such as copper, for example, and/or from materials such as Invar (a nickel-iron alloy) and Kovar (a nickel-cobalt-iron alloy) that have a low coefficient of thermal expansion. Each metal ribbon may be sandwiched between thin insulating sheets of material to form a flex circuit, with the insulating sheets patterned to expose portions of the metal ribbon (e.g., tabs 75) intended to make electrical contact with the solar cells. The insulating sheets may be formed from a polyimide, for example.

Any other suitable materials and configurations may also be used for the interconnects 70 that interconnect two series-connected strings of overlapping solar cells. For example, interconnects 70 may be similar or identical to any of the mechanically compliant interconnects 90 described below with respect to FIG. 6A-6C, 7A, 7B, 8A, 8B, or 9. Also, two or more interconnects 70 may be arranged in parallel similarly to as shown in FIGS. 7A and 7B described below to interconnect two groups of series-connected overlapping solar cells.

Although the use of interconnects 70 is described above with respect to solar cells 10 that include front surface bus bars 15 and back contact pads 30, such interconnects 70 may be used in combination with any of the variations of solar cell 10 described herein. In variations lacking bus bars 15, back contact pads 30, or both, interconnects 70 may be bonded to solar cells 10 using electrically conductive adhesives as described above, for example.

Mechanically compliant electrical interconnects similar or identical to interconnects 70 may also be used between every solar cell in a string of series-connected solar cells, or between every solar cell in a three solar cell or longer contiguous portion of series-connected string of solar cells. As shown in FIGS. 6A-6C, 7A, 7B, 8A, 8B, and 9, for example, each pair of overlapping solar cells 10 in a series-connected string of overlapping solar cells may be physically and electrically connected by mechanically compliant interconnects 90, each of which interconnects the front surface metallization of a solar cell with the back surface metallization of an adjacent solar cell. Such strings differ from conventionally tabbed strings at least because the adjoining solar cells in the illustrated strings overlap, and because the locations at which interconnects 90 are bonded to the front surfaces of solar cells 10 may be hidden from illumination by an overlapping solar cell. Mechanically compliant interconnects 90 may be attached to solar cells 10 with, for example, conventional electrically conductive solder, electrically conductive adhesives, adhesive films, or adhesive tapes as described above, or by any other suitable method.

Interconnects 90 are mechanically compliant. In particular, they are more mechanically compliant than solar cells 10 and more mechanically compliant than solder connections between bus bar 15 and back contact pad 30 of overlapping solar cells 10. Interconnects 90 may also be more mechanically compliant than bonds between overlapping solar cells formed from electrically conductive adhesives as described above. Interconnects 90 deform without cracking, detaching from the adjacent solar cells, or otherwise failing under strain resulting from thermal expansion mismatch between solar cells 10 and a substrate to which they are attached. Interconnects 90 may therefore provide strain relief to a string of interconnected groups of overlapping solar cells, thereby accommodating thermal expansion mismatch between solar cells 10 and a substrate and preventing the string from failing.

Interconnects 90 may be formed, for example, from highly conductive materials such as copper, for example, and/or from materials such as Invar and Kovar that have a low coefficient of thermal expansion. Interconnects 90 may be or comprise solder-coated copper ribbons, for example. Alternatively, interconnects 90 may be or comprise copper ribbons sandwiched between polyimide layers (for example, Kapton films) or other insulating layers, with the sandwiching layers patterned to expose the copper ribbon at locations to be bonded to solar cells. Any other suitable materials and configurations may be used for interconnects 90, in addition to those disclosed herein.

Figure 6A:
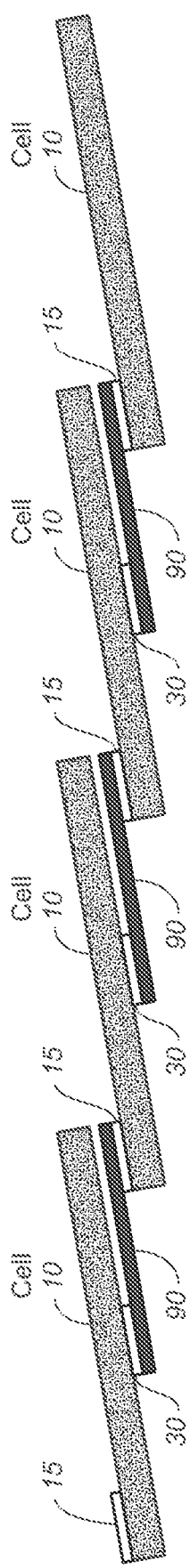
FIGS. 6A-6C show schematic cross-sectional diagrams illustrating additional examples of series-connected strings of overlapping solar cells.
Figure 6B:
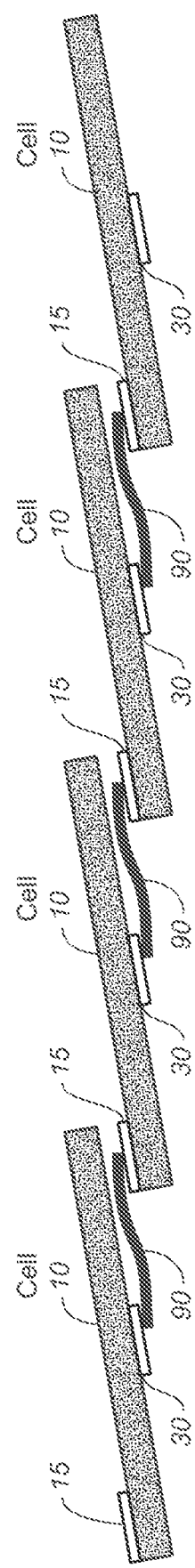
Figure 6C:
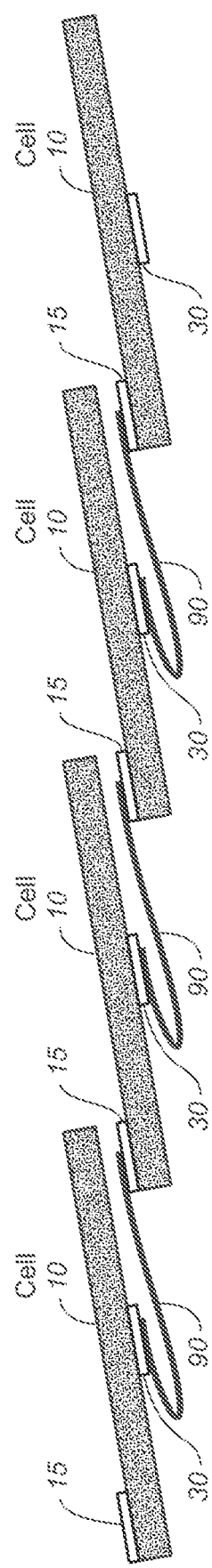
Figure 7B:
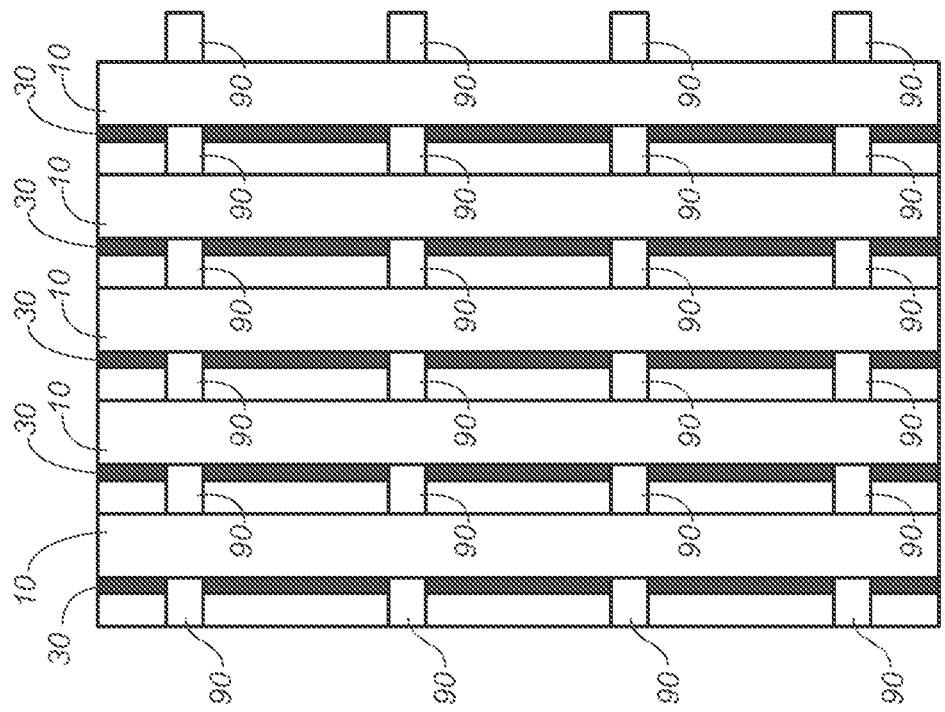
FIGS. 7A and 7B show front and rear views, respectively, of another example series-connected string of overlapping solar cells.
Figure 7A:
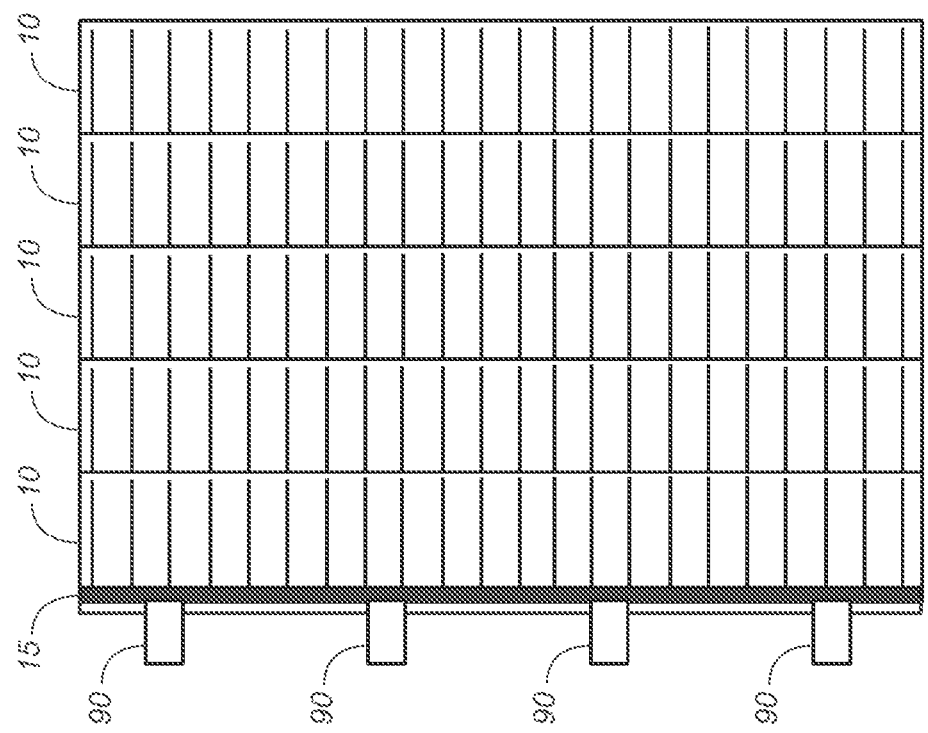

FIGS. 6A-6C show example cross-sectional views illustrating the interconnection of a string of overlapping solar cells 10 with mechanically compliant electrical interconnects 90. As illustrated in these examples, interconnects 90 may have a flat cross-sectional profile (FIG. 6A), a bent cross-sectional profile (FIG. 6B), or a looped cross-sectional profile (FIG. 6C). Any other suitable cross-sectional profile may also be used. Bent or looped cross-sectional profiles may increase mechanical compliance, compared to a flat cross-sectional profile.

In the examples illustrated in FIGS. 6A-6C and in later figures, back contact pad 30 is located away from the edge of solar cell 10, near the middle of the back surface. This is not required. Contact pad 30 may be positioned at any suitable location on the back surface of the solar cell. For example, contact pad 30 may be positioned adjacent to the overlapping edge of solar cell 10, as shown in FIG. 1B, or adjacent to the edge opposite from the overlapping edge.

FIGS. 7A and 7B show front and rear views, respectively, of an example string of series-connected overlapping solar cells. As shown in these figures, two or more interconnects 90 may be arranged in parallel with each other to interconnect adjacent overlapping solar cells. In the illustrated example, interconnects 90 have the form of ribbons with their long axes oriented perpendicular to the overlapping edges of adjacent solar cells. As another example (not shown), parallel interconnects 90 may have the form of two or more ribbons arranged in line with each other with their long axes oriented parallel to the overlapping edges of adjacent solar cells.

Figure 8B:
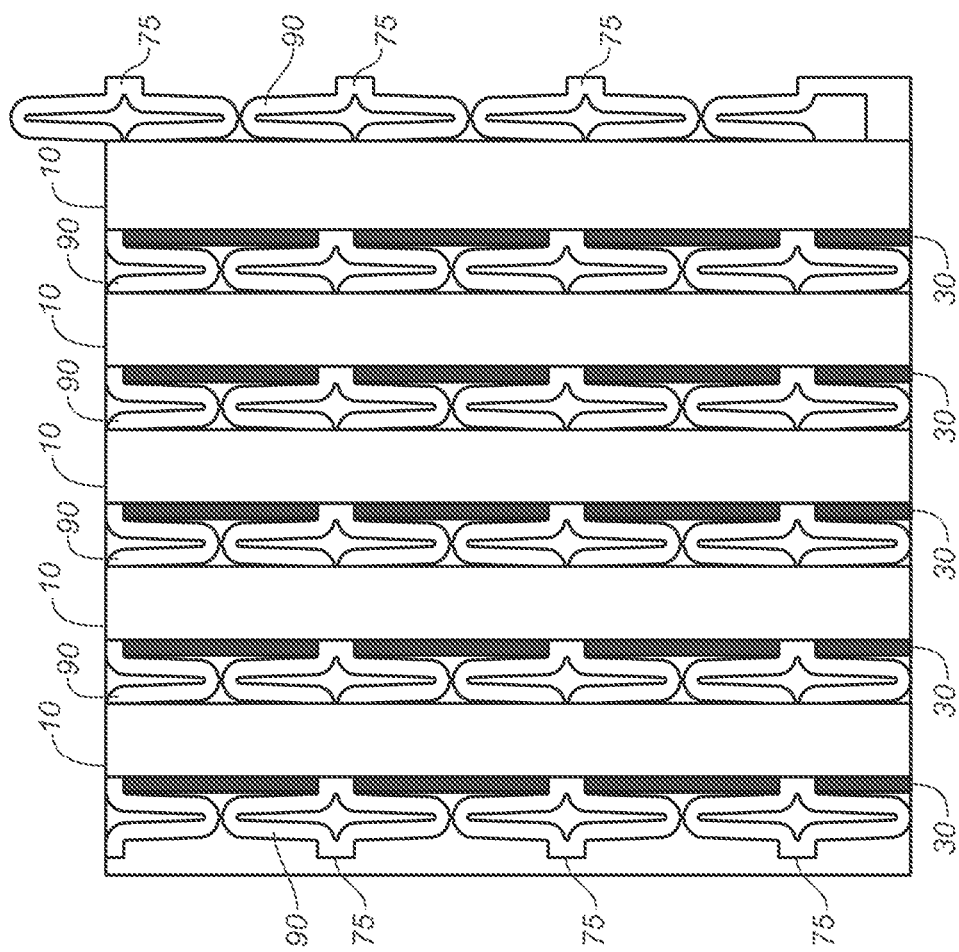
FIGS. 8A and 8B show front and rear views, respectively, of another example series-connected string of overlapping solar cells.
Figure 8A:
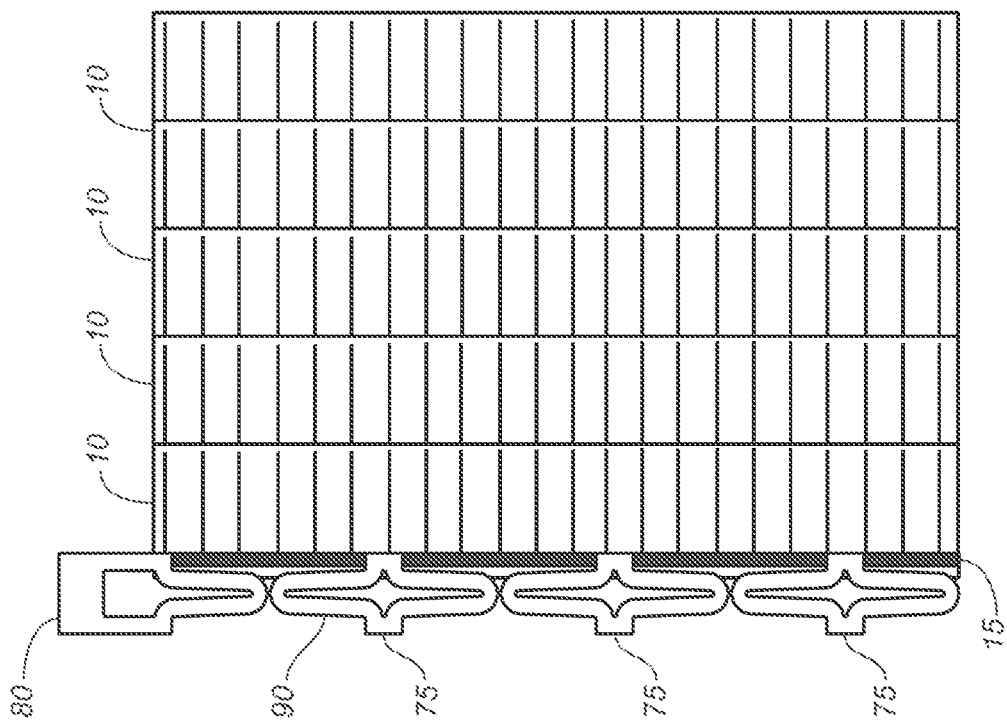
Figure 9:
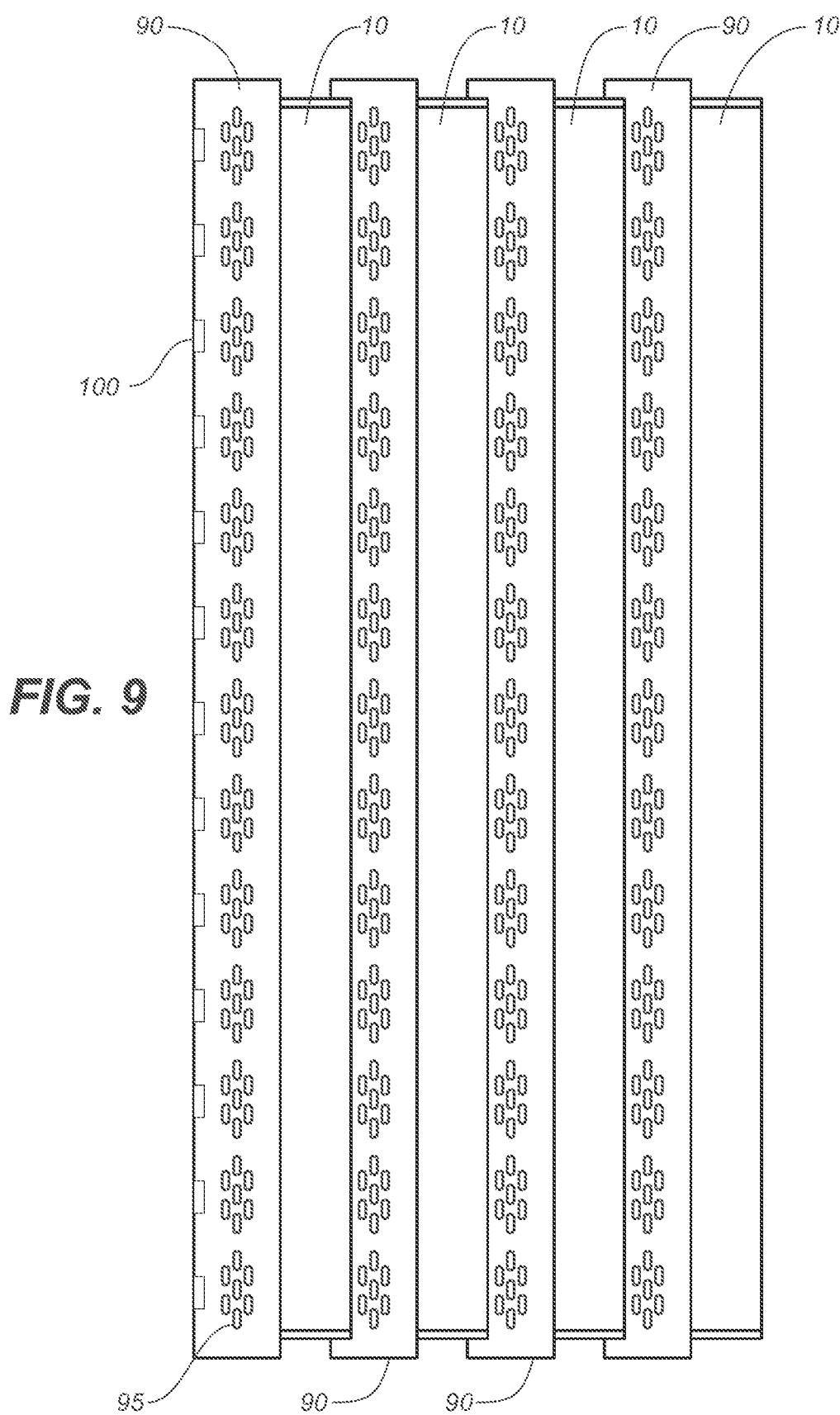
FIG. 9 shows a rear view of another example series-connected string of overlapping solar cells.

FIGS. 8A and 8B show front and rear views, respectively, of another example string of series-connected overlapping solar cells. FIG. 9 shows a rear view of yet another example string of series-connected overlapping solar cells. As shown in FIGS. 8A, 8B, and 9, interconnects 90 may have the form of ribbons oriented parallel to and extending along the length of the overlapping edges of adjacent solar cells.

Example interconnects 90 illustrated in FIGS. 8A and 8B are similar or identical to interconnects 70 illustrated in FIG. 4 and FIG. 5. In the variation illustrated in FIGS. 8A and 8B, each interconnect 90 includes two sets of tabs 75, with each set of tabs positioned on an opposite side of the long axis of the interconnect. Such an interconnect 90 may be positioned between two overlapping solar cells with its tabs 75 on one side making electrical contact to the bus bar 15 on the front surface of one of the solar cells, and with its tabs 75 on the other side making electrical contact to contact pad 30 on the back surface of the other solar cell. Also as illustrated in FIGS. 8A and 8B, interconnects 90 may optionally include bypass diode taps 80 that provide connection points for bypass diodes configured to bypass one or more solar cells in the event that one of the solar cells fails.

Example interconnects 90 illustrated in FIG. 9 have the form of rectangular ribbons patterned with slits or openings 95 that increase their mechanical compliance. The illustrated interconnects 90 also include contact pads 100 to be bonded to solar cells. Such interconnects 90 may, for example, be or comprise copper ribbons sandwiched between polyimide layers (for example, Kapton films) or other insulating layers, with the sandwiching layers patterned to expose the copper ribbon at the locations of contact pads 100.

Although the use of interconnects 90 is described above with respect to solar cells 10 that include front surface bus bars 15 and back contact pads 30, such interconnects 90 may be used in combination with any of the variations of solar cell 10 described herein. In variations lacking bus bars 15, back contact pads 30, or both, interconnects 90 may be bonded to solar cells 10 using electrically conductive adhesives as described above, for example.

Figure 10:
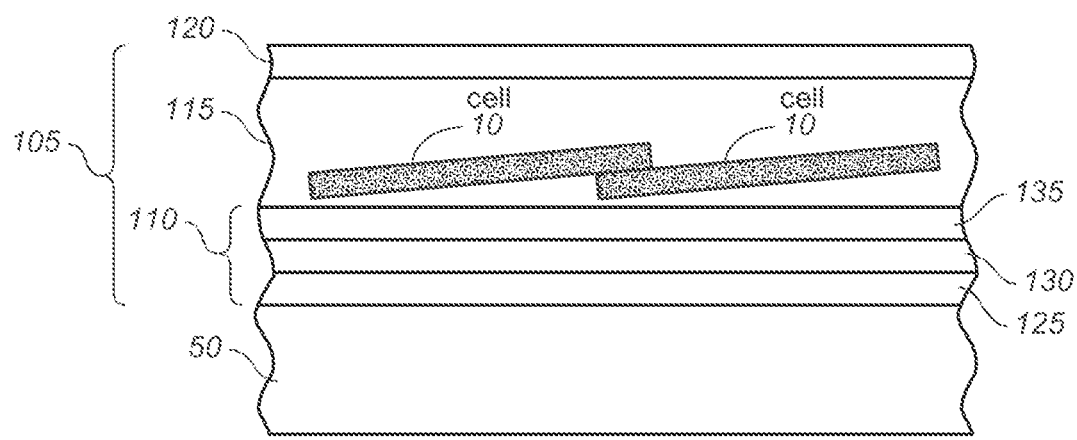
FIG. 10 shows a fragmentary schematic diagram of an example lamination stack, comprising solar cells, disposed on and adhering to a substrate.

Referring now to FIG. 10, a string of solar cells 10 may be disposed on a substrate 50 in a lamination stack 105 that adheres to the substrate. The lamination stack may comprise, for example, a thermally conductive encapsulant layer 110 disposed between the solar cells and the substrate, a clear encapsulant layer 115 disposed on the thermally conductive encapsulant layer, and a clear top sheet 120 disposed on the clear encapsulant layer 115. Solar cells 10 are typically disposed within the clear encapsulant layer 115 at its boundary with the thermally conductive encapsulant layer 110.

Thermally conductive encapsulant layer 110 comprises one or more materials that are selected to facilitate heat transfer from solar cells 10 to substrate 50 and/or to adhere to substrate 50, to solar cells 10, and to clear encapsulant layer 115. Material in encapsulant layer 110 may be selected to adhere to aluminum or aluminum-based alloys, for example. Thermally conductive encapsulant layer 110 may have a thickness for example, of about 0.1 millimeters to about 2.0 millimeters.

In the illustrated example, thermally conductive encapsulant layer 110 comprises a first thermally conductive adhesive layer 125, a dielectric layer 130, and a second thermally conductive adhesive layer 135. Dielectric layer 130 typically melts at a higher temperature than the surrounding adhesive layers, and consequently provides a barrier to physical and electrical contact between solar cells 10 and substrate 50 that survives a lamination process, further described below, by which lamination stack 105 is bonded to substrate 50. Adhesive layer 125 may comprise, for example, one or more thermally conductive polyolefins and may have a thickness, for example, of about 0.1 millimeters to about 2.0 millimeters. Dielectric layer 130 may comprise, for example, one or more fluoropolymers. The fluoropolymers may be selected, for example, from the group including, but not limited to, polyvinyl fluoride (PVF), polyvinylidene fluoride (PVDF), ethylene tetrafluoroethylene, and mixtures thereof. Dielectric layer 130 may have a thickness, for example, of about 0.1 millimeters to about 2.0 millimeters. Adhesive layer 135 may comprise, for example, one or more thermally conductive polyolefins and may have a thickness, for example, of about 0.1 millimeters to about 2.0 millimeters.

Any other suitable materials and configuration may be used for thermally conductive encapsulant layer 110 and its component layers 125, 130, and 135 described above. For example, in some variations dielectric layer 130 is absent. In such variations, encapsulant layer 115 may be, for example, a single layer of thermally conductive polyolefin.

Thermally conductive encapsulant layer 110 may be substantially reflective to solar radiation incident on it. For example, materials in encapsulant layer 110 may include pigments that make encapsulant layer 110 appear white. Such a reflective encapsulant layer 110 may reduce the heat absorbed by lamination stack 105, which may advantageously improve the efficiency with which solar cells 10 operate. In addition, if solar cells 10 are HIT solar cells with back surface metallization comprising fingers, as described above, then such a reflective encapsulant layer may reflect light that has passed unabsorbed through the HIT solar cell back into the solar cell where it may be absorbed to generate additional current, increasing the efficiency with which the solar cells operate. Alternatively, thermally conductive encapsulant layer 110 may be substantially absorbing for solar radiation incident on it. For example, materials in encapsulant layer 110 may include pigments that make encapsulant layer 110 appear black. Such an absorbing encapsulant layer 110 may increase the heat absorbed by lamination stack 105 and subsequently transferred to substrate 50, which may be advantageous if the collected heat is commercially valuable.

Referring again to FIG. 10, clear encapsulant layer 115 may comprise, for example a clear polyolefin, a clear polyimide, or a mixture thereof, and may have a thickness, for example, of about 0.1 millimeters to about 2.0 millimeters. Any other suitable materials and thicknesses may be used for clear encapsulant layer 115.

Clear top sheet 120 may comprise, for example, one or more clear fluoropolymers. The fluoropolymers may be selected, for example, from the group including, but not limited to, polyvinyl fluoride (PVF), ethylene tetrafluoroethylene, and mixtures thereof. Clear top sheet 120 may be selected to have a moisture transmission rate less than or equal to about 0.01 grams/meter-day, for example. Clear top sheet 120 may have a thickness, for example, of about 0.1 millimeters to about 1.0 millimeters. Any other suitable materials and thicknesses may be used for clear top sheet 120.

Solar cells 10 in lamination stack 105 may be or comprise any of the solar cells disclosed herein, and may be arranged in any of the configurations of series-connected overlapping solar cell strings disclosed herein. Any other suitable solar cells and string configurations may also be disposed in lamination stack 105, however. For example, although solar cells 10 in FIG. 10 are shown as overlapping in a shingle pattern, solar cells disposed in stack 105 may instead be configured in a non-overlapping manner and conventionally tabbed.

The component layers of lamination stack 105 may be positioned on a substrate 50 and then bonded to substrate 50 in a conventional laminator, for example, at an elevated temperature and with the application of pressure directed to force lamination stack 105 and substrate 50 together. During this lamination process, the temperature of substrate 50 and/or lamination stack 105 may be raised, for example, to between about 130° C. and about 160° C. If the solar cells in lamination stack 105 are configured in a non-overlapping manner, the pressure applied during the lamination process may be about 1.0 atmosphere, for example. The inventors have determined, however, that if the solar cells in lamination stack 105 are configured in an overlapping manner, as described herein for example, the maximum pressure applied during the lamination process may preferably be less than or equal to about 0.6 atmospheres, less than or equal to about 0.5 atmospheres, less than or equal to about 0.4 atmospheres, less than or equal to about 0.3 atmospheres, or between about 0.2 atmospheres and about 0.6 atmospheres.

In variations in which overlapped solar cells are bonded to each other with a conductive epoxy such as a silver-filled conductive epoxy, for example, it may be preferable to cure the epoxy while applying pressure to force the solar cells against each other. Curing the conductive bond under pressure in this manner may reduce the thickness of the conductive bond, thereby reducing the current path between solar cells and consequently reducing $I^2R$ losses in the string of solar cells. In one approach, the conducting bonds are cured under pressure to provide a series-connected string of overlapping solar cells before the string is laminated to a substrate. In this approach, the conducting bonds may be cured at a temperature of, for example, about 150° C. to about 180° C., and under a pressure of, for example, about 0.1 atmospheres to about 1.0 atmospheres, or about 0.1 to about 0.5 atmospheres, or about 0.1 to about 0.2 atmospheres. In another approach, the conducting bonds are cured under pressure during a lamination process similar to that described above. In this approach, the conducting bonds may be cured at a temperature of, for example, about 140 C to about 170 C, and under a pressure of, for example, about 0.1 atmospheres to about 1.0 atmosphere, or about 0.3 atmospheres to about 1 atmosphere, or about 0.5 atmospheres to about 1.0 atmosphere. Generally, the higher the temperature at which the conducting epoxy is cured, the more conductive the bond.

In some variations, the substrate and/or one or more lamination layers disposed beneath a series-connected string of overlapping solar cells is configured to have a surface that conforms in shape to the underside of the shingled string of solar cells. For example, a metal substrate may be patterned to have a surface with a saw-tooth cross section conforming to the shape of the underside of the shingled string of solar cells. In addition or alternatively, one or more dielectric sheets disposed between the substrate and the solar cells may be arranged or patterned to provide such a conforming surface. For example, such dielectric sheets may be overlapped in a shingle pattern providing an upper surface that conforms to the underside of the shingled solar cells. Supporting the shingled string of solar cells with a conforming support surface may improve thermal contact between the solar cells and the substrate.

Solar energy collectors comprising series-connected strings of overlapping solar cells as described herein may preferably be oriented with the exposed edges of the solar cells (e.g., edges 12 in FIG. 3A) away from the equator. With the shingled solar cells oriented in this manner, solar radiation incident on the cells will illuminate only the upper surfaces of the cells, not the exposed edges. This may increase the efficiency with which the collector converts incident solar radiation into electric power, because solar radiation incident on the exposed edges of the solar cells might not be efficiently converted to electricity.

The performance characteristics of solar cells may vary between solar cells even when the cells have essentially identical designs. Hence, two solar cells of identical design that are illuminated identically may produce currents of two different magnitudes. In a string of series-connected solar cells, however, all cells must handle an identical current. Mismatches between the performances of cells in the string decrease the overall efficiency of the string. This problem may be readily addressed with series-connected strings of overlapping solar cells as described herein. In any of the variations described above, the area of each solar cell not overlapped by adjacent solar cells may be selected to match or substantially match the electrical performance (e.g., the current) of all of the other solar cells in the string. That is, the overlap between adjacent cells may be adjusted to vary the illuminated area of each solar cell so that the electrical performance of each solar cell substantially matches that of the other solar cells. This may improve the overall efficiency of the string.

This disclosure is illustrative and not limiting. Further modifications will be apparent to one skilled in the art in light of this disclosure and are intended to fall within the scope of the appended claims.

What is claimed is:

1. An apparatus comprising:
   a first string of solar cells and a second string of solar cells, each string of solar cells comprising rectangular or substantially rectangular solar cells arranged in line with long sides of adjacent solar cells overlapping and conductively bonded to each other with an electrically conductive bonding material to electrically connect the solar cells in series,
   an interconnect different from the electrically conductive bonding material, the interconnect located at an end of the first string and electrically connecting the first string of solar cells to the second string of solar cells, the interconnect extending along an entire length of the long sides of the solar cells in the first and second strings of solar cells and interposed between the first and second strings of solar cells, the interconnect comprising a bypass diode tap located at one end of the interconnect and extending past short sides of the solar cells in the first and second strings, the bypass diode tap configured to provide a connection point for a bypass diode, and the bypass diode electrically connected to the bypass diode tap by a metal ribbon contact, the metal ribbon contact sandwiched between two insulating sheets, the metal ribbon contact comprising a narrow neck and a void space, the narrow neck and the void space configured to make the metal ribbon contact flexible, wherein the bypass diode, metal ribbon contact, and two insulating sheets form a flex circuit wherein the flex circuit is attached to a substrate supporting the first and second strings of solar cells by an adhesive layer.

2. The apparatus of claim 1, wherein the ratio of the length of a long side of the rectangular or substantially rectangular solar cells to the length of a short side of the rectangular or substantially rectangular solar cells is greater than or equal to three.

3. A solar device comprising:
a first string of rectangular or substantially rectangular crystalline silicon solar cells arranged in line with long sides of adjacent solar cells overlapping and conductively bonded to each other with an electrically conductive bonding material to electrically connect the solar cells in series;
a first end solar cell located at a first end of the first string;
a second end solar cell located at a second end of the first string;
a first electrically conductive interconnect different from the electrically conductive bonding material conductively bonded to the first end solar cell;
a second electrically conductive interconnect different from the electrically conductive bonding material conductively bonded to the second end solar cell,
the first and second interconnects each extending along an entire length of the long sides of the solar cells in the string of solar cells, the first and second interconnects each comprising a bypass diode tap located at one end of the interconnects and extending past short sides of the solar cells in the first string, the bypass diode tap configured to provide a connection point for a bypass diode; and
a bypass diode electrically connected between the first and second interconnects by two metal ribbon contacts, each the metal ribbon contact sandwiched between two insulating sheets, each metal ribbon contact comprising a narrow neck and a void space, the narrow neck and the void space configured to make the metal ribbon contact flexible, wherein the bypass diode, metal ribbon contacts, and two insulating sheets form a flex circuit wherein the flex circuit is attached to a substrate supporting the first string of solar cells by an adhesive layer, wherein either the first or the second electrically conductive interconnects is electrically connected to a second string of rectangular or substantially rectangular crystalline silicon solar cells and is interposed between the first and second strings of solar cells.

4. The apparatus of claim 1, wherein
the interconnect comprises a plurality of tabs configured to provide connection points to either the first or second string of solar cells.

5. The apparatus of claim 1, wherein the interconnect is mechanically compliant.

6. The apparatus of claim 1, wherein the bypass diode tap is a ribbon that extends laterally to a side of the first string of solar cells to connect to the first bypass diode.

7. The apparatus of claim 1, wherein:
the first string includes a first end and a second end;
the first string includes a group of solar cells that includes a first solar cell at the first end of the first string and a second solar cell that is between the first and second ends but not at the second end of the first string;
a first conductor that connects to the first solar cell;
a second conductor that connects to the second solar cell;
a second bypass diode that connects between the first and second conductors configured to bypass the group of solar cells within the first string.

8. The apparatus of claim 1, wherein the metal ribbon contact is formed from solder-coated metal.

9. The apparatus of claim 8, wherein the metal is copper.

10. The apparatus of claim 1, wherein the two insulating sheets are formed from polyimide.

11. The apparatus of claim 1, wherein one of the two insulating sheets comprises an opening configured to expose a region of the metal ribbon contact where the bypass diode is attached.

12. The apparatus of claim 1, wherein one of the two insulating sheets comprises an opening configured to expose a region of the metal ribbon contact where the metal ribbon contact is connected to the bypass diode tap.

13. The apparatus of claim 1, wherein the void space of the metal ribbon contact is oval shaped.

14. The apparatus of claim 1, wherein the bypass diode is attached to a substrate supporting the first and second strings of solar cells.

* * * * *